(12) United States Patent
Kimura

(10) Patent No.: US 10,684,342 B2
(45) Date of Patent: Jun. 16, 2020

(54) MRI APPARATUS, IMAGE PROCESSING DEVICE, AND GENERATION METHOD OF DIFFUSION-WEIGHTED IMAGE

(71) Applicant: TOSHIBA MEDICAL SYSTEMS CORPORATION, Otawara-Shi (JP)

(72) Inventor: Tokunori Kimura, Yaita (JP)

(73) Assignee: Canon Medical Systems Corporation, Otawara-shi (JP)

( * ) Notice: Subject to any disclaimer, the term of this patent is extended or adjusted under 35 U.S.C. 154(b) by 906 days.

(21) Appl. No.: 15/074,058

(22) Filed: Mar. 18, 2016

(65) Prior Publication Data
US 2016/0202338 A1 Jul. 14, 2016

Related U.S. Application Data

(63) Continuation of application No. PCT/JP2015/086433, filed on Dec. 25, 2015.

(30) Foreign Application Priority Data

Dec. 26, 2014 (JP) .................. 2014-264752

(51) Int. Cl.
*G01R 33/563* (2006.01)
*G01R 33/56* (2006.01)
*G01R 33/561* (2006.01)

(52) U.S. Cl.
CPC ... *G01R 33/56341* (2013.01); *G01R 33/5608* (2013.01); *G01R 33/5616* (2013.01)

(58) Field of Classification Search
CPC .......... G01R 33/56341; G01R 33/5608; G01R 33/5616

(Continued)

(56) References Cited

U.S. PATENT DOCUMENTS 7,049,815 B2 * 5/2006 Itskovich ............. G01V 3/32
324/303
7,355,407 B1 * 4/2008 Zhang ............... G01R 33/5616
324/309

(Continued)

FOREIGN PATENT DOCUMENTS

JP 9-173315 7/1997
JP 2006-521863 9/2006

(Continued)

OTHER PUBLICATIONS

Matthew D. Blackledge, et al., "Computed Diffusion-weighted MR Imaging May Improve Tumor Detection", Radiology, vol. 261, (2), 2011, 9 pgs.

(Continued)

*Primary Examiner* — Dixomara Vargas
(74) *Attorney, Agent, or Firm* — Oblon, McClelland, Maier & Neustadt, L.L.P.

(57) ABSTRACT

In one embodiment, an MRI apparatus includes: an MRI scanner configured to acquire N+1 or more diffusion-weighted images by differently setting parameter values among the diffusion-weighted images, with regard to N types of parameters, wherein N is a natural number equal to or more than two; and processing circuitry configured to generate a computed diffusion-weighted image having an arbitrary value for at least one of the N types of parameters, based on relationship between signal values of the acquired diffusion-weighted images and the parameter values differently set among the acquired diffusion-weighted images.

17 Claims, 18 Drawing Sheets

(58) Field of Classification Search
USPC .................. 324/300–322; 600/407–435; 382/128–131
See application file for complete search history.

(56) References Cited

U.S. PATENT DOCUMENTS

| | | | | |
|---|---|---|---|---|
| 8,228,063 | B2* | 7/2012 | Kimura | A61B 5/055 324/307 |
| 8,842,896 | B2* | 9/2014 | Hajnal | A61B 5/055 382/131 |
| 9,606,210 | B2* | 3/2017 | Dannels | G01R 33/56554 |
| 10,234,528 | B2* | 3/2019 | Dale | G01R 33/5608 |
| 10,359,490 | B2* | 7/2019 | Kuhara | G01V 3/32 |
| 2005/0162162 | A1* | 7/2005 | Itskovich | G01V 3/32 324/303 |
| 2010/0013475 | A1* | 1/2010 | Kimura | A61B 5/055 324/307 |
| 2010/0081918 | A1 | 4/2010 | Sugiura et al. | |
| 2010/0329528 | A1* | 12/2010 | Hajnal | A61B 5/055 382/131 |
| 2012/0019251 | A1 | 1/2012 | Umeda et al. | |
| 2012/0049845 | A1* | 3/2012 | Bito | G01R 33/485 324/309 |
| 2015/0285891 | A1* | 10/2015 | Dannels | G01R 33/56554 324/309 |
| 2015/0309143 | A1* | 10/2015 | Kuhara | G01R 33/50 324/309 |
| 2016/0018501 | A1* | 1/2016 | Kimura | A61B 5/055 324/322 |
| 2016/0084929 | A1* | 3/2016 | Dale | G01R 33/5608 324/309 |
| 2016/0192859 | A1* | 7/2016 | Shirai | A61B 5/0042 600/412 |
| 2016/0202338 | A1* | 7/2016 | Kimura | G01R 33/5608 324/309 |
| 2017/0023657 | A1* | 1/2017 | Tomoda | G01R 33/543 |
| 2017/0131376 | A1* | 5/2017 | Miyazaki | G01R 33/56308 |

FOREIGN PATENT DOCUMENTS

| | | |
|---|---|---|
| JP | 2010-99455 | 5/2010 |
| JP | 2011-24926 A | 2/2011 |
| JP | 2012-40362 | 3/2012 |
| WO | WO 2004/088345 A1 | 10/2004 |

OTHER PUBLICATIONS

International Search Report and Written Opinion dated Mar. 29, 2016 in PCT/JP2015/086433 (with English language translation of categories of cited documents).

Xiu-Zhong Yao, et al., "Comparison of diffusion-weighted MRI acquisition techniques for normal pancreas at 3.0 Tesla", Diagnostic and interventional radiology, vol. 20, No. 5, Jun. 19, 2014, pp. 368-373.

JE Simon, et al., "Diffusion-weighted Imaging (DWI) and Fluid-inversion Prepared Diffusion Imaging (FLIPD) in Acute Stroke", Proc. Intl. Soc. Mag. Reson. Med., vol. 10, 2002, 1 Page.

M. Blackledge, et al., "Computed Diffusion Weighted Imaging (cDWI) for Improving Imaging Contrast", Proc. Intl. Soc. Mag. Reson. Med., vol. 17, 2009, p. 4005 and cover page.

Tokunori Kimura, et al, "Computed Diffusion Weighted Imaging Under Rician Noise Distribution", Proc. Intl. Soc. Mag. Reson. Med., vol. 20, 2012, p. 3574.

International Preliminary Report on Patentability and Written Opinion dated Jun. 27, 2017 in PCT/JP/2015/086433 (submitting English language translation).

* cited by examiner

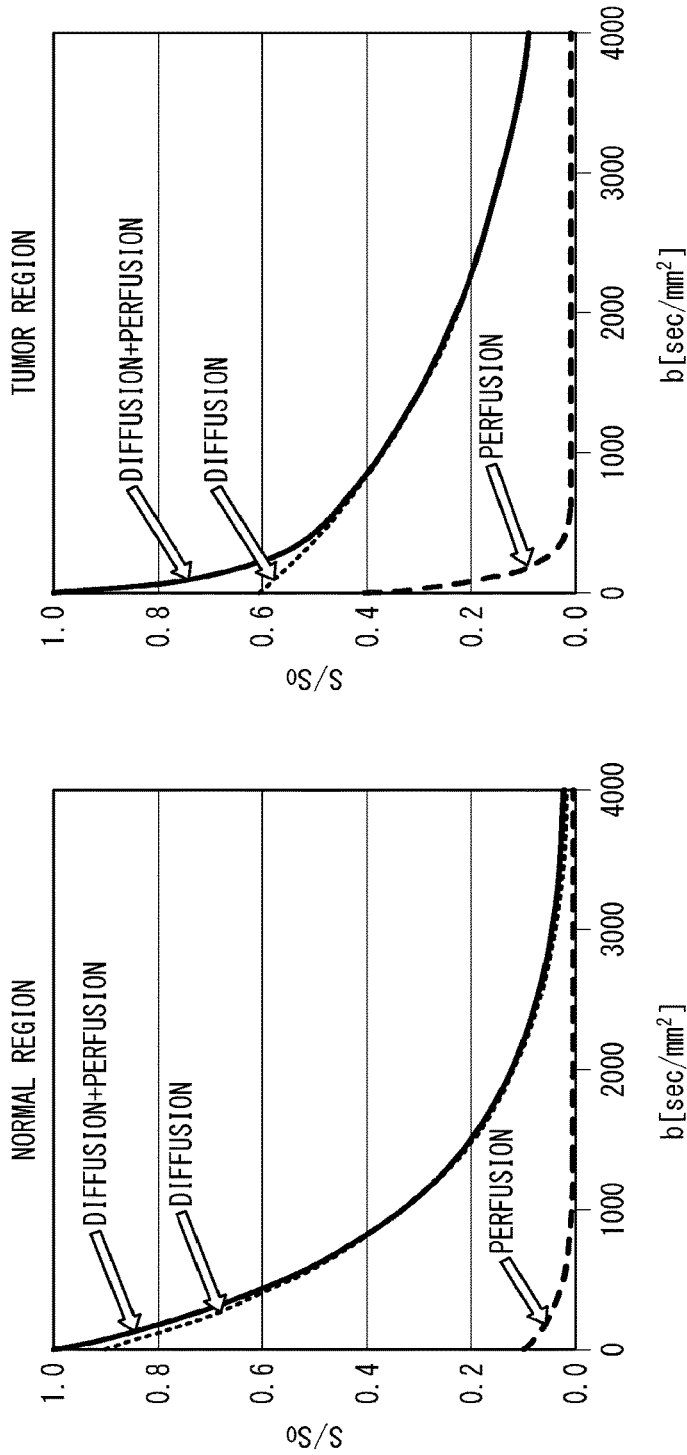

ADC(b1, b2) COMPUTED BY TWO b-VALUES (b1, b2)

| (b1, b2) | ADC(b1, b2) | | ERROR |
|---|---|---|---|
| | TUMOR REGION | NORMAL REGION | |
| (0, 1000) | $1.01*10^{-3}$ | $1.09*10^{-3}$ | LARGE |
| (500, 1000) | $5.30*10^{-4}$ | $1.05*10^{-3}$ | SMALL |
| (0, 2000) | $7.55*10^{-4}$ | $1.05*10^{-3}$ | LARGE |

FIG. 9A

| CORRECT ADC | $5.00*10^{-4}$ | $1.00*10^{-3}$ |
|---|---|---|

FIG. 9B

SIGNAL INTENSITY OF b=2000 COMPUTED BY USING ADC(0, 1000) AND ADC(500, 1000)

| ADC(b1, b2) | SIGNAL INTENSITY | | ERROR |
|---|---|---|---|
| | TUMOR REGION | NORMAL REGION | |
| ADC(0, 1000) | 0.133 | 0.113 | LARGE |
| ADC(500, 1000) | 0.214 | 0.118 | SMALL |

FIG. 9C

SIGNAL INTENSITY OF b=2000 (CORRECT VALUE)

| b | TUMOR REGION | NORMAL REGION |
|---|---|---|
| 2000 | 0.221 | 0.122 |

FIG. 9D

SCREEN FOR SETTING PARAMETERS USED FOR ACQUISITION OF DIFFUSION-WEIGHTED IMAGE

RECOMMENDED VALUES AT MEASUREMENT

| | b-VALUE | TE (ms) | TR (ms) | TI (ms) |
|---|---|---|---|---|
| FIRST DIFFUSION-WEIGHTED IMAGE IM1 | b1 / 50 ▶ | TE2 / 100 ▶ | TR2 (TR2≫T1) / 8000 ▶ | TI1 / – ▶ |
| SECOND DIFFUSION-WEIGHTED IMAGE IM2 | b2 (b2>b1) / 1000 ▶ | TE2 / 100 ▶ | TR2 / 8000 ▶ | TI1 / – ▶ |
| THIRD DIFFUSION-WEIGHTED IMAGE IM3 | b1 / 50 ▶ | TE1 (TE1<TE2) / 30 ▶ | TR2 / 8000 ▶ | TI1 / – ▶ |
| FOURTH DIFFUSION-WEIGHTED IMAGE IM4 | b1 / 50 ▶ | TE1 (TE1<TE2) / 30 ▶ | TR1 (TR1<TR2) / 1000 ▶ | TI1 / – ▶ |
| FIFTH DIFFUSION-WEIGHTED IMAGE IM5 | b1 / 50 ▶ | TE1 (TE1<TE2) / 30 ▶ | TR2 / 8000 ▶ | TI1 / 1000 ▶ |

SET

FIG. 16

MRI APPARATUS, IMAGE PROCESSING DEVICE, AND GENERATION METHOD OF DIFFUSION-WEIGHTED IMAGE

CROSS-REFERENCE TO RELATED APPLICATIONS

This application is a Continuation Application of No. PCT/JP2015/86433, filed on Dec. 25, 2015, and the PCT application is based upon and claims the benefit of priority from Japanese Patent Application No. 2014-264752 filed on Dec. 26, 2014, the entire contents of each of which are incorporated herein by reference.

FIELD

Embodiments described herein relate generally to an MRI (Magnetic Resonance Imaging) apparatus, an image processing device, and a generation method of a diffusion-weighted image.

BACKGROUND

An MRI apparatus is an imaging apparatus configured to magnetically excite nuclear spin of an object placed in a static magnetic field with RF (Radio Frequency) pulses and generate an image by reconstructing MR (Magnetic Resonance) signals emitted from the object due to the excitation.

In the field of MRI, an imaging technique called DWI (Diffusion Weighted Imaging) is known. In DWI, a strong flow-encoding gradient magnetic field pulse called an MPG (Motion Probing Gradient) is applied. Application of an MPG pulse causes difference in MR signal intensity (i.e., contrast) between respective body tissues depending on difference in diffusion coefficient between those body tissues, and thus a diffusion-weighted image in which difference in diffusion coefficient is enhanced can be generated.

Degree of diffusion of each body tissue is indicated by an index called an ADC (Apparent Diffusion Coefficient). Further, as an index indicating intensity of an MPG pulse, a b-value (i.e., b-factor) is used.

In order to enhance contrast caused by difference in ADC, it is necessary to set a b-value to a sufficiently large value, and a value around 1000 is generally used for a b-value in many cases. However, when a malignant tumor is depicted, a much larger b-value is required in some cases because a b-value around 1000 is not large enough. On the other hand, it is not easy to set a b-value to a further larger value because of restriction in various elements such as limitation of hardware.

For the above reason, a technology has been developed, in which a diffusion-weighted image corresponding to a much larger b-value is obtained by computation from a diffusion-weighted image actually imaged with a b-value within a standard range. This technology is referred to as computed DWI.

BRIEF DESCRIPTION OF THE DRAWINGS

In the accompanying drawings:

FIG. 8A to FIG. 8C are schematic diagrams illustrating examples of computed signal intensities for a model of a tumor and a model of a normal tissue, each of which has a diffusion coefficient composed of plural components;

FIG. 9A to FIG. 9D are schematic diagrams illustrating relationship between a selection range of b-values and computation error of signal intensities;

FIG. 16 is a schematic diagram illustrating an example of a screen for setting parameters for acquisition of diffusion-weighted images in the first to fourth embodiments;

DETAILED DESCRIPTION

Figure 1:
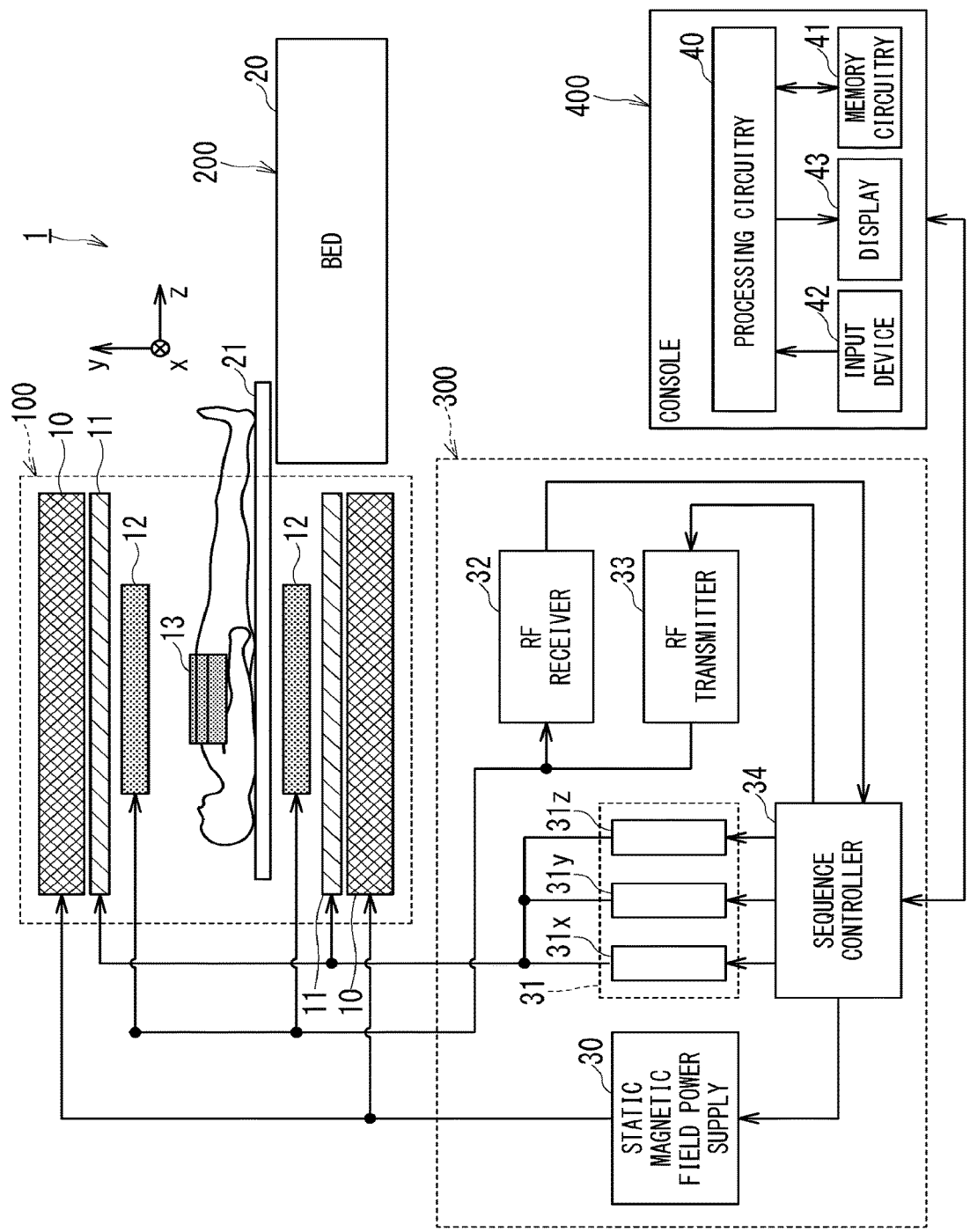
FIG. 1 is a functional block diagram illustrating an example of overall configuration of an MRI apparatus of the first embodiment.

As described above, b-values around 1000 are conventionally used in a normal DWI in many cases, and also used in an imaging for obtaining a computed DWI. In order to set a b-value to a value around 1000, it is inevitable to lengthen pulse length of each MPG pulse to some extent. However, in a pulse sequence of DWI, it is necessary to insert two MPG pulses in a period from an application timing of an excitation pulse to a start timing of acquisition of MR signals. Thus, the time interval between application of an excitation pulse and acquisition of the main part of an MR signal, i.e., the effective echo time TE is lengthened. For example, when a b-value is 1000, the effective echo time TE becomes approximately 60 millisecond or more.

Meanwhile, since an ADC of a tumor tissue is smaller than an ADC of a normal tissue, a tumor tissue is depicted as high-luminance pixels in a diffusion-weighted image. Thus, DWI has come to be frequently used not only for tumor diagnosis in a brain but also for tumor diagnosis in the whole body including an abdomen such as a liver, a kidney, and a prostate gland.

However, in general, a transverse (i.e., spin-spin) relaxation time T2 in an abdominal tissue such as a liver, a kidney, and a prostate gland is short. Further, a transverse relaxation time T2 of a nerve tissue is also short, although an ADC of the nerve tissue is small and the nerve tissue is depicted as high-luminance pixels in a diffusion-weighted image.

Thus, in conventional DWI, the effective echo time TE becomes longer than a transverse relaxation time T2 of each of a tumor tissue and a nerve tissue. As a result, an MR signal of each of a tumor tissue and a nerve tissue is attenuated at the time of signal acquisition, and thereby relative signal intensity of each of a tumor tissue and a nerve tissue with respect to signal intensity of a background decreases. In other words, though a tumor and a nerve should be depicted as pixels of enhanced MR signals in DWI, intensity of MR signals from a tumor and a nerve becomes small due to the effective echo time TE being longer than a transverse relaxation time T2 of each of a tumor tissue and a nerve tissue.

In addition, since an image generated by DWI substantially becomes a T2-weighted image if a transverse relaxation time T2 is smaller than the effective echo time TE, contrast caused by difference in ADC and contrast caused by difference in T2 are mixed in such a diffusion-weighted image. Accordingly, contrast caused by difference in ADC is buried in contrast caused by difference in T2, and thus it becomes difficult to extract contrast of ADC-difference which is the original target to be obtained.

Hereinafter, embodiments of an MRI apparatus, an image processing device, and a generation method of a diffusion-weighted image which are configured to solve the above-described problem will be described by reference to the accompanying drawings. In one embodiment, an MRI apparatus includes: an MRI scanner configured to acquire N+1 or more diffusion-weighted images by differently setting parameter values among the diffusion-weighted images, with regard to N types of parameters, wherein N is a natural number equal to or more than two; and processing circuitry configured to generate a computed diffusion-weighted image having an arbitrary value for at least one of the N types of parameters, based on relationship between signal values of the acquired diffusion-weighted images and the parameter values differently set among the acquired diffusion-weighted images.

First Embodiment

FIG. 1 is a functional block diagram illustrating an example of overall configuration of an MRI apparatus 1 of the first embodiment. The MRI apparatus 1 includes hardware components such as a gantry 100, a bed 200, a control cabinet 300, and a console 400.

The gantry 100 includes, for example, a static magnetic field magnet 10, a gradient coil 11, a WB (Whole Body) coil 12, and these components are included in a cylindrical housing. The bed 200 includes a bed body 20 and a table 21. In addition, an array coil 13 disposed close to an object is included in the MRI apparatus 1.

The control cabinet 300 includes, for example, a static magnetic field power supply 30, three gradient coil power supplies 31 (31x for an X-axis, 31y for a Y-axis, and 31z for a Z-axis), an RF receiver 32, an RF transmitter 33, and a sequence controller 34. In addition, the console 400 is configured as a computer including processing circuitry 40, memory circuitry 41, an input device 42, and a display 43.

The static magnetic field magnet 10 of the gantry 100 is substantially in the form of a cylinder, and generates a static magnetic field inside the bore, i.e., the space inside the cylindrical structure of the static magnetic field magnet 10 which is an imaging region of an object (e.g., a patient). The static magnetic field magnet 10 includes a superconductive coil inside, and the superconductive coil is cooled down to an extremely low temperature by liquid helium. The static magnetic field magnet 10 generates the static magnetic field by supplying the superconductive coil with the electric current provided from the static magnetic field power supply 30 in an excitation mode. Afterward, the static magnetic field magnet 10 shifts to a permanent current mode, and thereby the static magnetic field supply 30 is separated. Once it enters the permanent current mode, the static magnetic field magnet 10 continues to generate a strong static magnetic field for a long time, e.g., over one year. Incidentally, the static magnetic field magnet 10 may be configured as a permanent magnet.

The gradient coil 11 is also substantially in the form of a cylinder, and is fixed to the inside of the static magnetic field magnet 10. This gradient coil 11 applies gradient magnetic fields to an object in the respective directions of the X-axis, the Y-axis, and the Z-axis, by using the electric currents supplied from the gradient coil power supplies 31x, 31y, and 31z.

The bed body 20 of the bed 200 can move the table 21 in the upward and downward directions, and moves the table 21 with an object loaded thereon to a predetermined height before imaging. Afterward, at the time of imaging, the bed body 20 moves the table 21 in the horizontal direction so as to move the object inside the bore.

The WB coil 12 is shaped approximately in the form of a cylinder so as to surround an object, and is fixed to the inside of the gradient coil 11. The WB coil 12 applies each RF pulse transmitted from the RF transmitter 33 to an object, and receives MR signals emitted from the object due to excitation of hydrogen nuclei.

The array coil 13 is an RF coil and receives MR signals emitted from the object at a position close to the object. The array coil 13 is, for example, composed of plural coil elements. Although various types of the array coil 13, such as a head coil, a chest coil, a spine coil, and a body coil, can be used depending on an anatomical imaging part of an object, the array coil 13 for a chest is illustrated in FIG. 1 as an example.

The RF transmitter 33 transmits RF pulses to the WB coil 12 based on a command from the sequence controller 34.

The RF receiver 32 receives MR signals detected by the WB coil 12 and/or the array coil 13, and transmits raw data obtained by digitizing the received MR signals to the sequence controller 34.

The sequence controller 34 performs a scan of the object by driving the gradient coil power supplies 31, the RF transmitter 33, and the RF receiver 32, under the control of the console 400. Then, when the sequence controller 34 receives the raw data from the RF receiver 32 by performing the scan, the sequence controller 34 transmits the raw data to the console 400.

The console 400 includes the above-described processing circuitry 40, the memory circuitry 41, the input device 42, and the display 43. The console 400 controls the entirety of the MRI apparatus 1. Specifically, the console 400 receives commands and various kinds of information such as imaging conditions inputted via a mouse and a keyboard of the input device 42 operated by a user such as an inspection examiner. Then, the processing circuitry 40 causes the sequence controller 34 to perform a scan based on the inputted imaging conditions, and reconstructs images based on the raw data transmitted from the sequence controller 34. The reconstructed images are stored as image data in the memory circuitry 41 and displayed on the display 43.

As an imaging technique performed by an MRI apparatus, DWI is widely known.

Figure 2:
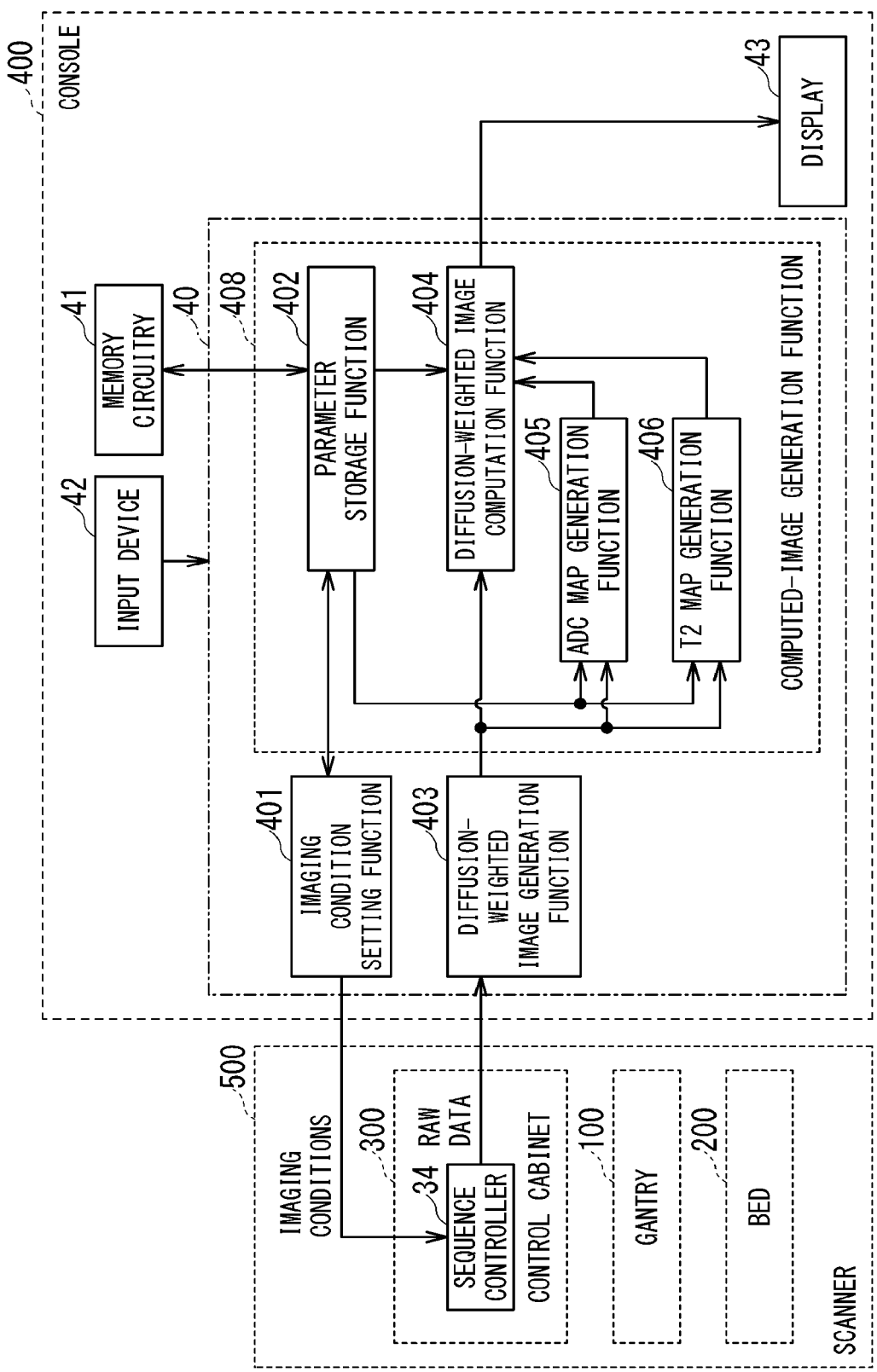
FIG. 2 is a functional block diagram illustrating an example of configuration relevant to DWI of the first embodiment.

FIG. 2 is a functional block diagram illustrating an example of configuration relevant to DWI in the MRI apparatus 1 of the first embodiment.

As shown in FIG. 2, the processing circuitry 40 of the MRI apparatus 1 implements each of an imaging condition setting function 401, a parameter storage function 402, a diffusion-weighted image generation function 403, a diffusion-weighted image computation function 404, an ADC map generation function 405, and a T2 map generation function 406.

The processing circuitry 40 includes at least one processor, and the processor implements each of the above-described functions 401 to 406 by executing programs stored in the memory circuitry 41. However, implementation of those functions 401 to 406 is not limited to the above-described software processing. For example, the processing circuitry 40 may include hardware such as an ASIC (Application Specific Integrated Circuit) and an FPGA (Field Programmable Gate Array) so that this hardware implements those functions 401 to 406 by hardware processing. Additionally or alternatively, the processing circuitry 40 may implement each of the above-described functions 401 to 406 by a combination of hardware and software processing.

Incidentally, a computed-image generation function 408 is configured of the parameter storage function 402, the diffusion-weighted image computation function 404, the ADC map generation function 405, and the T2 map generation function 406.

In addition, an MRI scanner 500 is configured of the gantry 100, the bed 200, and the control cabinet 300. The MRI scanner may further include a part of the processing circuitry which implements an imaging condition setting function 401 and a diffusion-weighted image generation function 403.

Further, since the input device 42 and the display 43 in FIG. 2 are the same as those in FIG. 1, they are indicated by the same symbols as FIG. 1.

Out of the above-described functions, the parameter storage function 402 is a function of storing imaging conditions such as types of pulse sequence of DWI and various parameters of each pulse sequence. These imaging conditions are inputted by an operator via, for example, the input device 42. Additionally or alternatively, some imaging conditions may be set in such a manner that an operator changes preliminarily stored imaging conditions by manipulating the input device 42.

As one of parameters peculiar to pulse sequences of DWI, a b-value (i.e., b-factor) which is a parameter relevant to an MPG (motion probing gradient) pulse is known. Each b-value is inputted via the input device 42 and stored in the memory circuitry 41 by the parameter storage function 402. In addition to a b-value, parameters such as a repetition time TR and an effective echo time TE are inputted via the input device 42 and stored in the memory circuitry 41.

The imaging condition setting function 401 is a function of reading out parameters stored in the memory circuitry 41 and setting these parameters on the sequence controller 34 as imaging conditions at the time of performing DWI. The sequence controller 34 performs DWI according to the imaging conditions being set in the above manner.

The diffusion-weighted image generation function 403 is a function of performing reconstruction processing such as inverse Fourier transform on MR signals acquired by DWI so as to generate a diffusion-weighted image. In the first embodiment as described below, three or more diffusion-weighted images are generated by performing DWI in which plural pulse sequences being different from each other are included. For example, DWI is performed by executing three pulse sequences composed of the first to third pulse sequences, and the first, second, and third diffusion-weighted images are generated so as to respectively correspond to the first, second, and third pulse sequences.

The respective b-values and effective echo times TE of the first to third pulse sequences are set so that a combination pattern of a b-value and an effective echo time TE is different between the first, second, and third pulse sequences. Although details will be described below, b-values of the first, second, and third pulse sequences are respectively defined as the first b-value, the second b-value, and the third b-value. Similarly, effective echo times TE of the first, second, and third pulse sequences are respectively defined as the first effective echo time TE, the second pulse sequence, and the third effective echo time TE. Three generated (or acquired) diffusion-weighted images are once stored in an appropriate memory.

The computed-image generation function 408 is a function of generating a computed diffusion-weighted image corresponding to an arbitrary effective echo time TE and an arbitrary b-value, based on computation using the first to third b-values, the first to third effective echo times TE, and signal intensity of each pixel of the first to third diffusion-weighted images.

More specifically, the ADC map generation function 405 of the computed-image generation function 408 computes, for example, an ADC of the object for each pixel based on the first and second b values and signal intensity of each pixel of the first and second diffusion-weighted images so as to generate an ADC map. Here, an ADC map is a map in which a pixel value of each pixel is the ADC value computed for the pixel of the same position in a diffusion-weighted image.

In addition, the T2 map generation function 406 of the computed-image generation function 408 computes, for example, a transverse relaxation time T2 of the object for each pixel based on the first effective echo time TE, the third effective echo time TE, and signal intensity of each pixel of the first and third diffusion-weighted images so as to generate a T2 map. Here, a T2 map is a map in which a pixel value of each pixel is the value of the transverse relaxation time T2 computed for the pixel of the same position in a diffusion-weighted image.

Moreover, the diffusion-weighted image computation function 404 of the computed-image generation function 408 generates a computed diffusion-weighted image corresponding to an arbitrary effective echo time TE and an arbitrary b-value, based on the ADC map, the T2 map, and signal intensity of each pixel of any one of the first to third diffusion-weighted images. The computed diffusion-weighted image generated in the above manner is, for example, displayed on the display 43.

In general, an image called a diffusion-weighted image often indicates an image obtained by reconstructing MR signals acquired with the use of a comparatively large b-value (e.g., b=1000). However, out of b-values used for the above-described first to third pulse sequences, a case where the b-value is small (e.g., a value close to zero) or a case where the b-value is zero may be included. In the present specification, an image which is obtained by reconstructing MR signals acquired with the use of such a small b-value for the purpose of generating a computed diffusion-weighted image is also referred to as a diffusion-weighted image. This holds true not only for the first embodiment but also for other embodiments.

Figure 3:
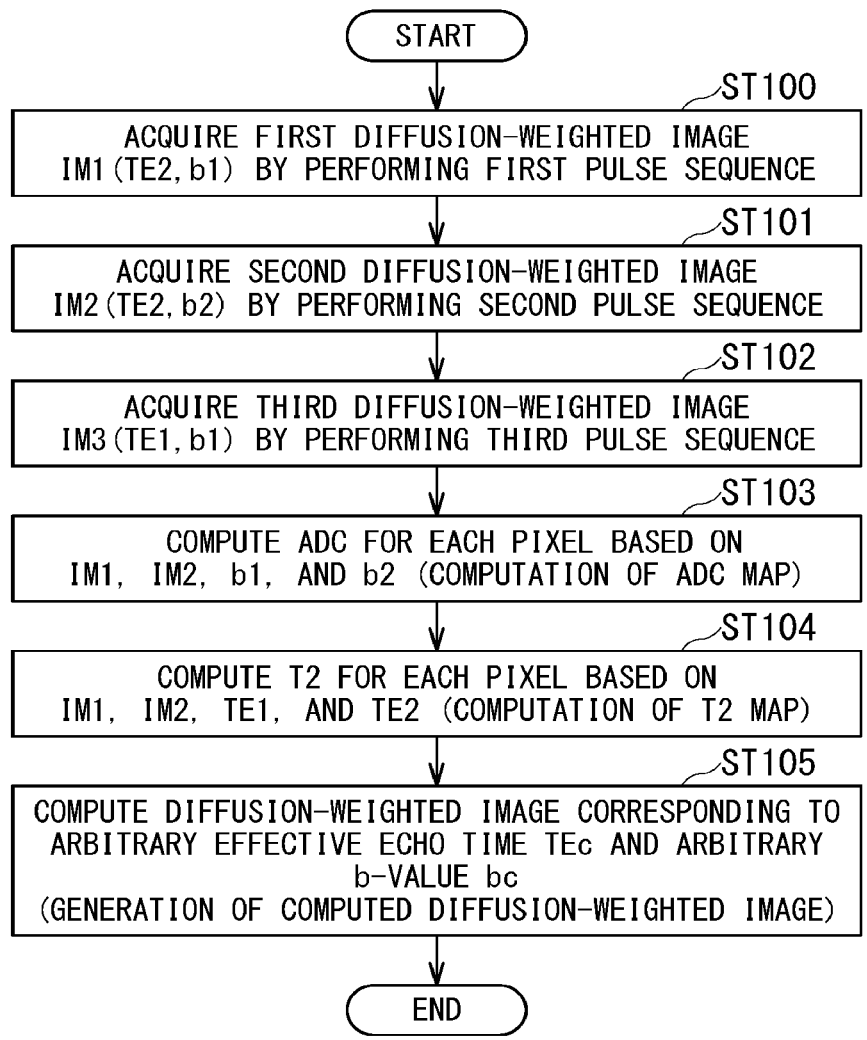
FIG. 3 is a flowchart illustrating an example of processing performed by the MRI apparatus of the first embodiment.

FIG. 3 is a flowchart illustrating an example of processing of generating a computed diffusion-weighted image performed by the MRI apparatus 1 of the first embodiment. Hereinafter, an operation performed by the MRI apparatus 1 will be described according to this flowchart.

In the step ST100, the MRI scanner 500 acquires the first diffusion-weighted image IM1 (TE2, b1) by performing the first pulse sequence.

In the step ST101, the MRI scanner 500 acquires the second diffusion-weighted image IM2 (TE2, b2) by performing the second pulse sequence, in similar a manner.

In the step ST102, the MRI scanner 500 acquires the third diffusion-weighted image IM3 (TE1, b1) by performing the third pulse sequence, in similar a manner.

Figure 4:
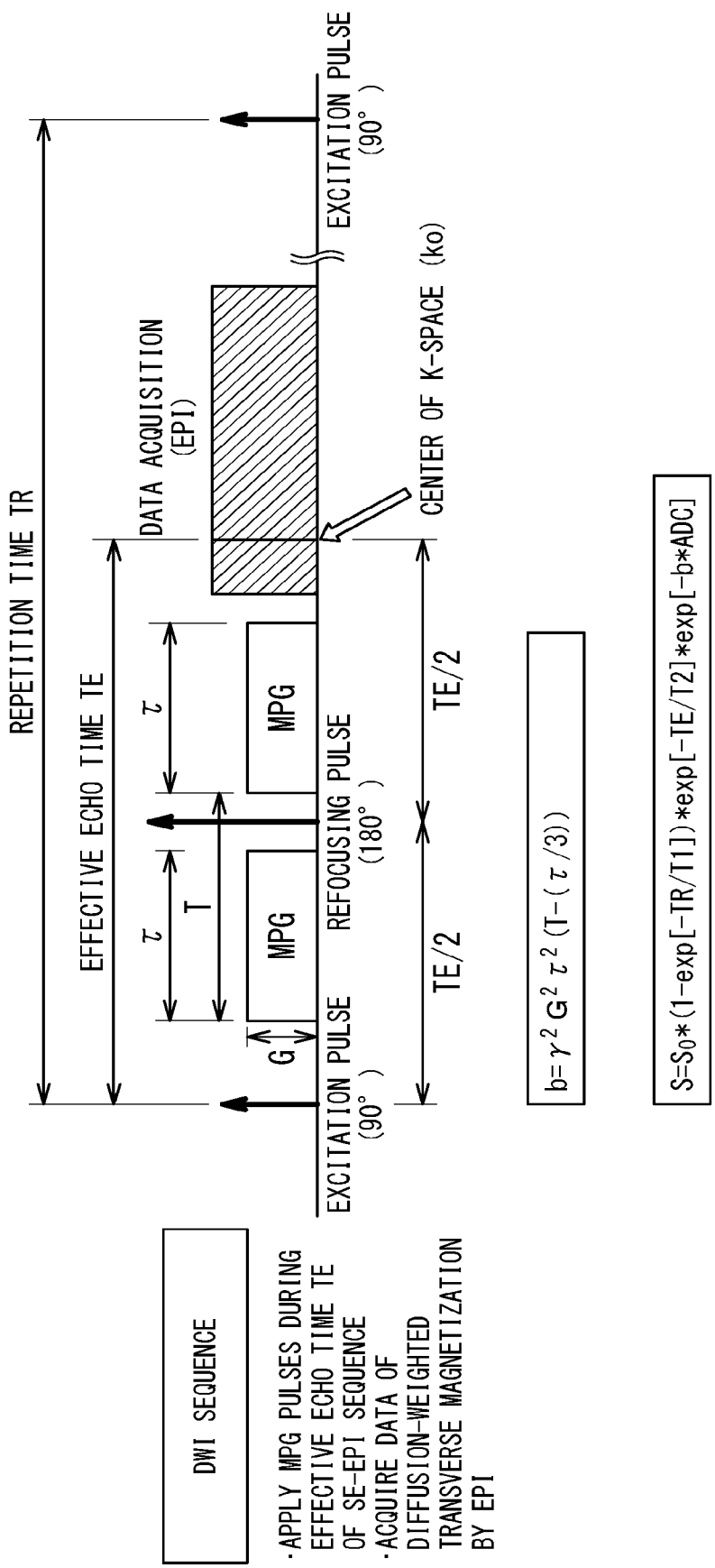
FIG. 4 is a timing chart illustrating the first example of a pulse sequence used for DWI.

FIG. 4 is a timing chart illustrating a sequence obtained by inserting MPG pulses for diffusion-weighting into a sequence of SE (spin echo) type EPI (echo planer imaging), as the first example of a type of pulse sequence commonly used for the first to third pulse sequences. In this sequence, a refocusing pulse whose flip angle is 180° is applied TE/2 after the application timing of an excitation pulse whose flip angle is 90°, and data acquisition is started substantially TE/2 after the application timing of the refocusing pulse. Here, TE indicates an effective echo time. To be precise, an effective echo time TE is defined as the period from the timing of applying an excitation pulse to the timing of acquiring data of the center of a k-space in an EPI sequence.

An MPG pulse is a gradient magnetic field pulse applied in order to enhance diffusion. As shown in FIG. 4, one MPG pulse is applied in a period from the completion timing of applying the excitation pulse to the start timing of applying the refocusing pulse, and another MPG pulse is applied in a period from the completion timing of applying refocusing pulse to the start timing of data acquisition.

As an index indicative of magnitude of the effect of an MPG pulse on an ADC of a tissue, a b-value (i.e., b-factor) is generally used. A b-value is given by the following formula (1).

$$b = \gamma G^2 \tau^2 \{T - (\tau/3)\} \quad \text{Formula (1)}$$

In the formula (1), b is a b-value, γ is a magnetogyric ratio, G is intensity of an MPG pulse, τ is pulse length of an MPG pulse, T is time interval between the leading edge timing of the first MPG pulse and the leading edge timing of the posterior MPG pulse.

In single-shot SE-type EPI, all the k-space data necessary for reconstructing an image of one slice are acquired in one data acquisition associated with one excitation pulse. By contrast, in multi-shot SE-type EPI, processing of acquiring all the k-space data necessary for reconstructing an image of one slice is divided into plural parts and performed. In the case of multi-shot EPI, a sequence unit shown in FIG. 4 is repeated at intervals of repetition time TR.

Signal intensity S (of the MR signal to be arranged at the center of a k-space) at the timing when the effective echo time TE elapses from the application timing of the excitation pulse is given by the following formula (2).

$$S = S_0 * (1 - \exp[-TR/T1]) * \exp[-TE/T2] * \exp[-b * ADC] \quad \text{Formula (2)}$$

In the formula (2), $S_0$ is a constant, TR is a repetition time, TE is an effective echo time, b is a b-value given by the formula (1). In addition, T1, T2, and ADC are a longitudinal relaxation time (i.e., spin-lattice relaxation time) T1 of each tissue of an object, a transverse relaxation time T2 of each tissue of an object, and an apparent diffusion coefficient of each tissue of an object, respectively.

Out of the respective parameters in the formula (2), a repetition time TR, an effective echo time TE, and a b-value are parameters which change depending on a pulse sequence (hereinafter, sometimes referred to as sequence parameters). Out of the respective parameters in the formula (2), a longitudinal relaxation time T1, a transverse relaxation time T2, and an ADC are parameters which change depending on a tissue of an object (hereinafter, sometimes referred to as tissue parameters).

In the first embodiment, the first, second, and third pulse sequences, in each of which two types of parameters out of the sequence parameters, i.e., an effective echo time TE and a b-value, are changed, are used in the steps ST100 to ST102. In other words, two different combination patterns of an effective echo time TE and a b-value are used in each of the first, second, and third pulse sequences.

Figure 5:
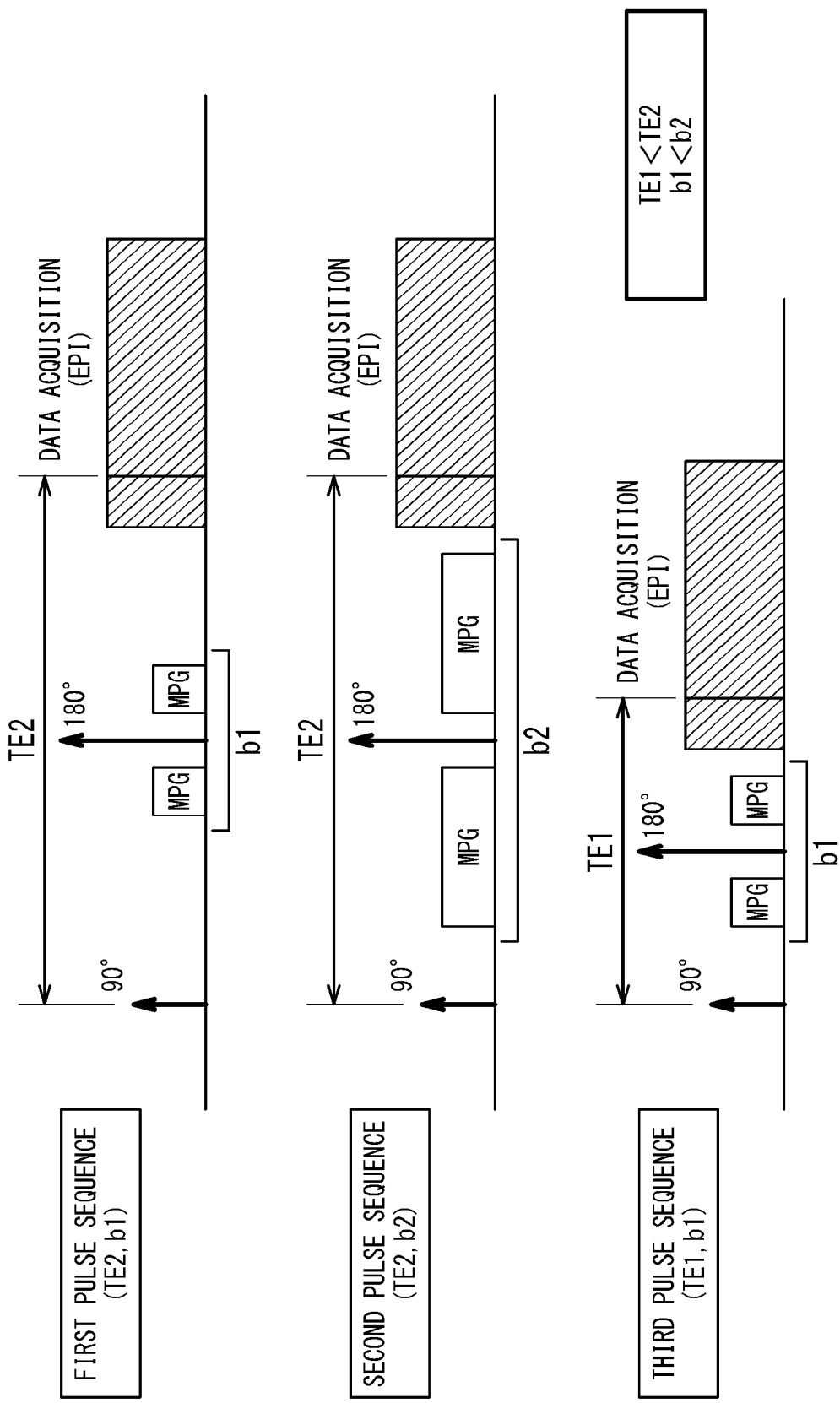
FIG. 5 is a timing chart illustrating examples of the first to third pulse sequences used in the first embodiment.

FIG. 5 is a timing chart illustrating an example of each of the first, second, and third pulse sequences on the top part, the middle part, and the bottom part, respectively. In the first pulse sequence, the first effective echo time (i.e., the effective echo time of the first pulse sequence) is set to TE2, and the first b-value (i.e., the b-value of the first pulse sequence) is set to b1. In the second pulse sequence, the second effective echo time (i.e., the effective echo time of the second pulse sequence) is set to TE2, and the second b-value (i.e., the b-value of the second pulse sequence) is set to b2. Further, in the third pulse sequence, the third effective echo time (i.e., the effective echo time of the third pulse sequence) is set to TE1, and the third b-value (i.e., the b-value of the third pulse sequence) is set to b1.

Here, the effective echo time TE2 used for the first and the second pulse sequences is defined as a value longer than the third effective echo time TE1 used for the third pulse sequence (TE1<TE2). In addition, the second b-value b2 used for the second pulse sequence is defined as a value longer than the b-value b1 used for the first and third pulse sequences (b1<b2).

Although sequences of single shot SE-type EPI are shown in FIG. 5, each sequence shown in FIG. 5 is repeated at intervals of a repetition time TR in the case of multi-shot EPI. In this case (i.e., in the multi-shot EPI case), the value of a repetition time TR is unified through the first to third pulse sequences.

Returning to FIG. 3, in the step ST100, the first pulse sequence with the effective echo time TE2 and the b-value b1 is performed and the first diffusion-weighted image IM1 (TE2, b1) is generated by reconstructing MR signals acquired by the first pulse sequence.

Similarly, in the step ST101, the second pulse sequence with the effective echo time TE2 and the b-value b2 is performed and the second diffusion-weighted image IM2 (TE2, b2) is generated by reconstructing MR signals acquired by the second pulse sequence.

Further, in the step ST102, the third pulse sequence with the effective echo time TE1 and the b-value b1 is performed and the third diffusion-weighted image IM3 (TE1, b1) is generated by reconstructing MR signals acquired by the third pulse sequence.

Here, signal intensity of each pixel of the first diffusion-weighted image IM1, signal intensity of each pixel of the second diffusion-weighted image IM2, and signal intensity of each pixel of the third diffusion-weighted image IM3 are respectively defined as S1 (TE2, b1), S2 (TE2, b2), and S3 (TE1, b1), and are given by the following formulas (3) to (5) based on the formula (2).

$$S1(TE2,b1)=S_0*(1-\exp[-TR/T1])*\exp[-TE2/T2]*\exp[-b1*ADC] \quad \text{Formula (3)}$$

$$S2(TE2,b2)=S_0*(1-\exp[-TR/T1])*\exp[-TE2/T2]*\exp[-b2*ADC] \quad \text{Formula (4)}$$

$$S3(TE1,b1)=S_0*(1-\exp[-TR/T1])*\exp[-TE1/T2]*\exp[-b1*ADC] \quad \text{Formula (5)}$$

As described above, a repetition time TR is common to formulas (3) to (5), the effective echo time TE2 is longer than the effective echo time TE1, and the b-value b2 is larger than the b-value b1.

Next, in the step ST103, ADCs are computed for the respective pixels based on the first diffusion-weighted image TM1, the second diffusion-weighted image TM2, the b-values b1 and b2.

Specifically, on the basis of the formulas (3) and (4), the signal intensity ratio given by the following formula (6) is computed.

$$S2(TE2,b2)/S1(TE2,b1)=\exp[-(b2-b1)*ADC] \quad \text{Formula (6)}$$

Then, on the basis of the formula (6), ADCs of the respective pixels, i.e., an ADC map is computed by using the following formula (7).

$$ADC=-\ln[S2(TE2,b2)/S1(TE2,b1)]/(b2-b1) \quad \text{Formula (7)}$$

Next, in the step ST104, a transverse relaxation time T2 is computed for each pixel based on the first diffusion-weighted image IM1, the third diffusion-weighted image IM3, the effective echo time TE1, and the effective echo time TE2. Specifically, on the basis of the formulas (4) and (5), signal intensity ratio given by the following formula (8) is computed.

$$S1(TE2,b1)/S3(TE1,b1)=\exp[-(TE2-TE1)/T2] \quad \text{Formula (8)}$$

Then, on the basis of the formula (8), a transverse relaxation time T2 of each pixel, i.e., a T2 map is computed by using the following formula (9).

$$T2=-(TE2-TE1)/\ln[S1(TE2,b1)/S3(TE1,b1)] \quad \text{Formula (9)}$$

When ADC values and T2 values for the respective pixels are obtained in the above manner, signal intensity Sc (TEc, bc) corresponding to an arbitrary effective echo time TEc and an arbitrary b-value bc can be computed based on the following formula (10) by using any one of the formulas (3) to (5), for example, by using the formula (5).

$$Sc(TEc,bc)=S3(TE1,b1)*\exp[-(TEc-TE1)/T2]*\exp[-(bc-b1)*ADC] \quad \text{Formula (10)}$$

Figure 6:
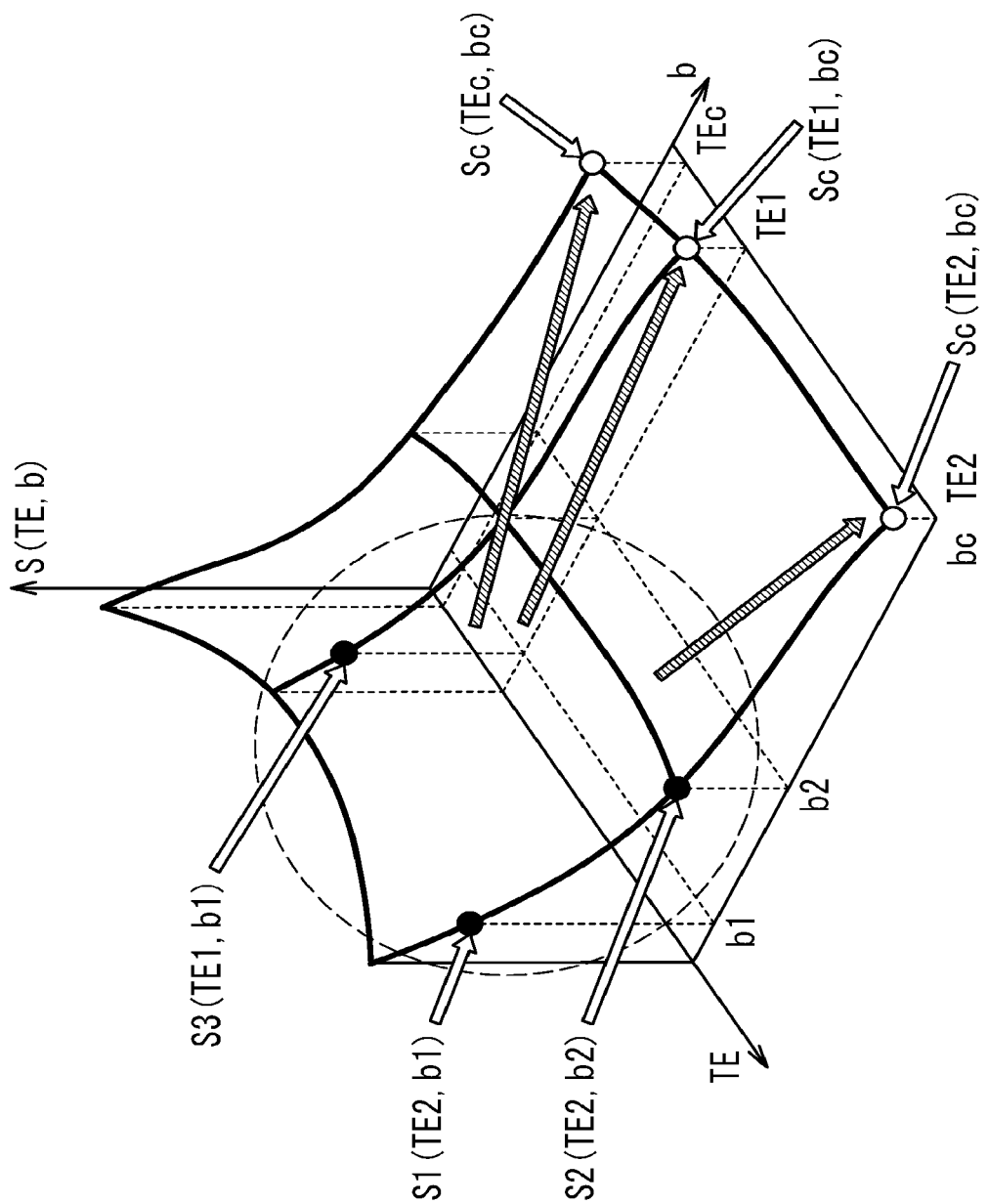
FIG. 6 is a schematic diagram illustrating relationship between a computed signal intensity Sc and three signal intensities S1, S2, and S3 acquired in actual imaging.

FIG. 6 is a schematic diagram illustrating relationship between computed signal intensity Sc(TEc, bc) and three signal intensities S1(TE2, b1), S2(TE2, b2), and S3(TE1, b1) acquired by actual imaging, in a signal space S(TE, b). In FIG. 6, the first horizontal axis indicates an effective echo time TE, the second horizontal axis indicates a b-value, and the vertical axis indicates signal intensity S.

JP 2010-99455 A discloses a technique of computing signal intensity Sc (TE2, bc) having a large b-value from two signal intensities S1(TE2, b1) and S2(TE2, b2) in FIG. 6, under the premise that bc>b2>b1. This conventional technology corresponds to computing a diffusion-weighted image having a b-value larger than the b-value b2 of the second pulse sequence by using the first and second pulse sequences in FIG. 5. However, when the b-value of the second pulse sequence is set to a value around 1000 as a typical value, it is necessary to set the pulse length of each MPG pulse to a long value to some extent and thereby the effective echo time TE2 becomes long. For example, the effective echo time TE2 becomes a value equal to or larger than 60 milliseconds. However, a transverse relaxation time T2 of a tumor and/or a nerve is generally short, and is usually shorter than the comparatively long effective echo time TE2 of the above-described conventional technology. As a result, MR signals from a tumor and a nerve are attenuated at the time of signal acquisition, and relative signal intensity of each of a tumor and a nerve to their background is decreased. In other words, MR signals of a tumor and a nerve, which should be high-level MR signals by DWI, result in low-level MR signals for the reason that their effective echo times TE is longer than their transverse relaxation time T2.

In addition, if an effective echo time TE is longer than a transverse relaxation time T2, the generated diffusion-weighted image substantially becomes a T2-weighted image and thus contrast caused by difference in ADC and contrast caused by difference in T2 are mixed in the generated diffusion-weighted image. Accordingly, contrast caused by difference in ADC, which is the original target to be obtained, is buried in contrast caused by difference in T2 and becomes difficult to be extracted.

By contrast, according to the MRI apparatus 1 of the first embodiment, a diffusion-weighted image of signal intensity Sc (TEc, bc) corresponding to an arbitrary b-value bc and an arbitrary effective echo time TEc can be computed. This means that a diffusion-weighted image corresponding to a large b-value bc and an extremely short effective echo time TEc can be computed. For example, a diffusion-weighted image of signal intensity Sc(TEc, bc) corresponding to bc≥2000 (milliseconds) and TEc≤10 (milliseconds) can be computed. As an extreme example, a diffusion-weighted image corresponding to an effective echo time TEc=0 millisecond can also be computed.

As a result, even a tissue having a short transverse relaxation time T2, such as a tumor and a nerve, can be depicted as pixels with strong signal intensity by avoiding attenuation of signal intensity due to transverse relaxation. In addition, influence of contrast caused by difference in T2 can be eliminated by a short effective echo time TEc. Thus, MR signals from a tumor and a nerve which are diffusion-weighted due to difference in ADC can be accurately depicted with strong signal intensity.

(Magnitude Relation of Sequence Parameter)

An arbitrary effective echo time TEc may be set so as to be equal to the shortest effective echo time TE1 of the effective echo times TE1 and TE2 (TE1<TE2) used for the first to third pulse sequences (i.e., TEc=TE1). Additionally or alternatively, an arbitrary effective echo time TEc may be set to a value shorter than the shortest effective echo time TE1 in the first to third pulse sequences (i.e., TEc<TE1).

If an arbitrary effective echo time TEc is set to TE1, the formula (10) is simplified like the following formula (11).

$$Sc(TEc,bc)=S3(TE1,b1)*\exp[-(bc-b1)*ADC] \quad \text{Formula (11)}$$

Thus, in this case, computation of a transverse relaxation time T2 for each pixel (i.e., computation of a T2 map) becomes unnecessary and its computation time is shortened.

Meanwhile, an arbitrary b-value bc may be set to the largest b-value b2 of the b-values b1 and b2 used for the first to third pulse sequences (i.e., bc=b2). Additionally or alternatively, an arbitrary b-value bc may be set to a value larger than the largest b-value b2 in the first to third pulse sequences (i.e., bc>b2).

In the above-described example, the MRI scanner 500 acquires the first and second diffusion-weighted images by setting the respective b-values of the first and second pulse sequences to values different from each other (b1≠b2, b1<b2) and setting the effective echo time TE to the same value TE2 between the first and second pulse sequences. Further, the MRI scanner 500 acquires the third diffusion-weighted image by setting the b-value of the third pulse sequence to the smallest value b1 of the b-values of the first and second pulse sequences and setting the effective echo time TE of the third pulse sequence to the value TE1 shorter than the effective echo time TE2 of the first and second pulse sequences. In other words, a restriction, such that a common b-value is used in any two pulse sequences out of the three pulse sequences and a common effective echo time is used in any two pulse sequences out of the three pulse sequences, is imposed. By imposing such a restriction on the first to third pulse sequences, computation of ADC and T2 is facilitated.

However, the above-described restriction on b-values and effective echo times TE can be eliminated. For example, three combinations of an effective echo time TE and a b-value used for the first, second, and third pulse sequences are defined as (TE1, b1), (TE2, b2), and (TE3, b3), respectively. In this case, unless all of the effective echo times TE1, TE2, and TE3 are the same value, any values can be used for the effective echo times TE1, TE2, and TE3. In other words, the effective echo times TE1, TE2, and TE3 may be different from each other, or any two of the effective echo times TE1, TE2, and TE3 may be equal to each other and different from the remaining one.

Similarly, unless all of the b-values b1, b2, and b3 are the same value, any values can be used for the b-values b1, b2, and b3. In other words, the b-values b1, b2, and b3 may be different from each other, or any two of the b-values b1, b2, and b3 may be equal to each other and different from the remaining one.

When all of the effective echo times TE1, TE2, and TE3 are different from each other and all of the b-values b1, b2, and b3 are different from each other as an example in the above case, it cannot be analytically solved. In this case, however, numerical solution may be used for determining unknown ADC and T2, if at least three formulas (3) to (5) are present.

Modifications of First Embodiment

Hereinafter, some modifications of the first embodiment will be described.

In the first modification, the computed-image generation function 408 generates dynamic computed diffusion-weighted images, by continuously changing at least one of an arbitrary effective echo time TEc and an arbitrary b-value bc for those dynamic computed diffusion-weighted images to be generated. Then, the display 43 continuously displays these dynamic computed diffusion-weighted images. The effective echo time TEc and/or the b-value bc by which a tumor and a nerve are most satisfactorily depicted can be easily determined by observing such dynamic display.

In the second modification, when a computed diffusion-weighted image for a nerve is generated, the processing circuitry 40 sets an application direction of MPG pulses in the first to third pulse sequences to a direction perpendicular to a running direction of a nerve to be depicted. It is known that an ADC value of a nerve is comparatively large in its running direction but is smaller in the direction perpendicular to its running direction than an ADC value of water of a background and an ADC value of a soft tissue.

As a method of using the above-described feature, a method, in which MR signals from a nerve are enhanced while MR signals from water and soft tissues are attenuated by applying each MPG pulse in the direction perpendicular to a running direction of a nerve, has been reported. However, a transverse relaxation time T2 of a nerve such as a cerebral nerve is short, whereas a transverse relaxation time T2 of CSF (Cerebrospinal Fluid) existing in the background of a nerve is long. Thus, in conventional DWI, MR signals emitted from a nerve are attenuated due to a long effective echo time TE, and thus, a nerve is buried in background tissues such as CSF.

By contrast, in the present embodiment, the first to third diffusion-weighted images are acquired by applying MPG pulses in a direction perpendicular to a running direction of a nerve, and then, a computed diffusion-weighted image corresponding to an extremely short effective echo time TEc can be generated based on the first to third diffusion-weighted images. As a result, a nerve to be depicted is clearly distinguished in the generated diffusion-weighted image from its background such as CSF, without attenuating the MR signals from the nerve.

In the third modification, a type of pulse sequence different from the pulse sequences of the first embodiment is used.

Although the MRI scanner 500 is assumed to acquire the first to third diffusion-weighted images by using the pulse sequences of SE-EPI type DWI (FIG. 4 and FIG. 5) in the above-described first embodiment, a type of pulse sequence for obtaining the first to third diffusion-weighted images is not limited to the above-described one.

Figure 7:
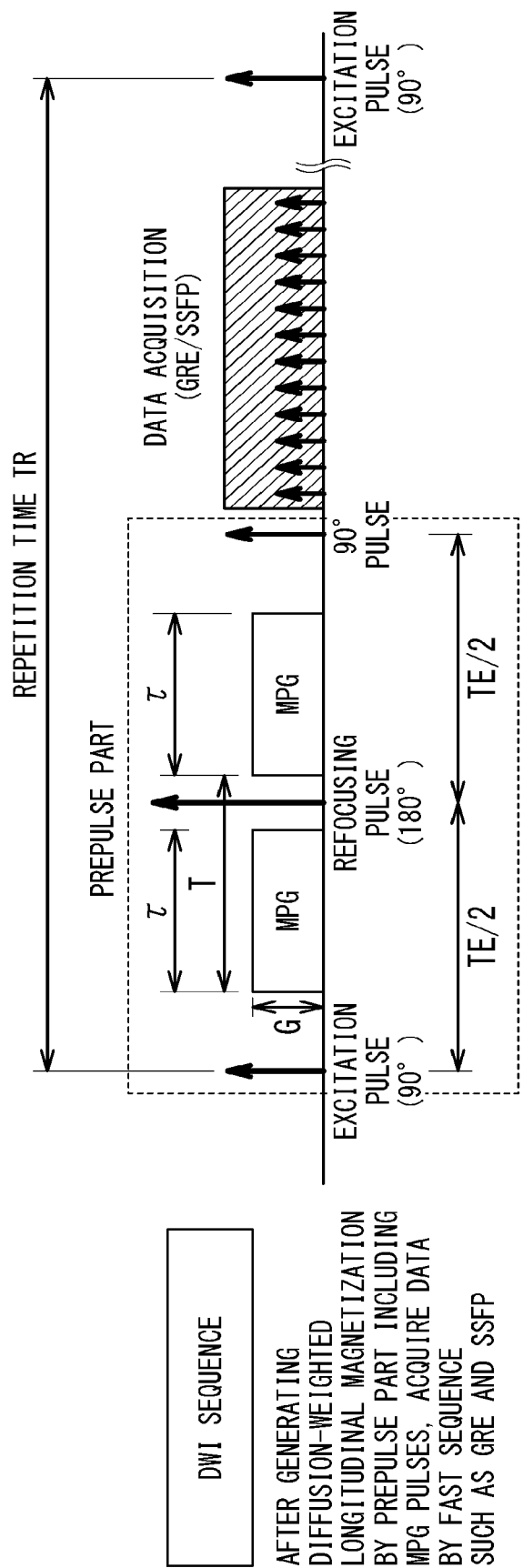
FIG. 7 is a timing chart illustrating the second example of a pulse sequence used for DWI.

FIG. 7 is a timing chart illustrating an example of a pulse sequence referred to as MSDE (Motion-sensitized Diffusion Equilibrium) or DSDE (Diffusion-sensitizes Diffusion Equilibrium). The first to third diffusion-weighted images may be acquired by using the pulse sequence shown in FIG. 7, for example. In the pulse sequence shown in FIG. 7, a prepulse part is composed of a 90° excitation pulse, an anterior MPG pulse, a 180° refocusing pulse, a posterior MPG pulse and a 90° RF pulse. In this prepulse part, a transverse magnetic field which is diffusion-weighted is generated by a series of the 90° excitation pulse, the anterior MPG pulse, the 180° refocusing pulse, and the posterior MPG pulse. Then a diffusion-weighted longitudinal magnetic field is generated by applying the subsequent 90° RF pulse to return the generated transverse magnetic field to a longitudinal magnetic field. Afterward, data acquisition is performed on the longitudinal magnetic field which is diffusion-weighted by the prepulse part, by applying a fast sequence such as a GRE (gradient echo) type sequence or an SSFP (steady-state free precision).

As described above, a type of pulse sequence used by the MRI scanner 500 for acquiring the first to third diffusion-weighted images is not limited to a specific one. In other words, any pulse sequence can be adopted as the first to third pulse sequences used for acquiring the first to third diffusion-weighted images, if only signal intensity S of the pulse sequence can be formulated based on sequence parameters, such as an effective echo time TE and a b-value, and tissue parameters of an object tissue, such as an ADC and a transverse relaxation time T2.

Furthermore, a type of pulse sequence may be different between the first, second, and third pulse sequences. For example, consider a case where a parameter set (TE2, b1) is used for the first pulse sequence and another parameter set (TE2, b2) is used for the second pulse sequence on the premise that b2 is larger than b1. In this case, the third pulse sequence is satisfactory as long as its effective echo time TE1 is shorter than TE2, and application of an MPG pulse (i.e., setting of a b-value) is not necessarily required. Thus, as the third pulse sequence in this case, an ordinary pulse sequence without application of an MPG pulse such as an SE type sequence, a fast SE type sequence, and a GRE type sequence can be adopted. Also in this case, normal image data of PDW (Proton-Density-Weighted) images or T1W (T1-weighted) images, which are previously and/or separately imaged from the above first and second pulse sequences for the same patient without application of an MPG pulse, can be used for the third diffusion-weighted image without newly performing the third pulse sequence for generating a computed diffusion-weighted image. Note that in the case of using the above normal image data and omitting the third pulse sequence, it is assumed that (a) positional adjustment between the above normal image data and the first and second diffusion-weighted images and (b) processing of matching the above normal image data with the first and second diffusion-weighted images in terms of matrix size are preliminarily performed as needed.

Meanwhile, a diffusion coefficient sometimes becomes a resultant value of plural components in an intravital diffusion phenomenon because of some reasons as follows. For example, diffusion is influenced by bloodstream and body motions, and/or an intracellular component and an extracellular component are mixed in diffusion. Usually, it is enough to treat a diffusion coefficient as a resultant value of two components. For example, the resultant diffusion coefficient is defined as D, and its respective components are defined as Dd and Dp, their relationship is given by D=Dd+Dp. Here, Dd is smaller Dp. A comparatively small value attributable to diffusion of a tissue is assumed as Dd, and a comparatively large value attributable to perfusion of fluid such as blood flow is assumed as Dp.

FIG. 8A is a table illustrating model values of Dd and Dp for receptive models of a tumor region and a normal region. In addition, model values of volume ratio f for a tumor region and a normal region are also shown in the table of FIG. 8A.

FIG. 8B illustrates an example of a relative value $S/S_0$ with respect to a b-value in a normal region based on the model values in FIG. 8A. In FIG. 8B, the bold broken line indicates a case where the diffusion coefficient is composed of only DP (i.e., perfusion), the fine broken line indicates a case where the diffusion coefficient is composed of only Dd (i.e., diffusion), and the bold solid line indicates a case where the diffusion coefficient is a combined diffusion coefficient composed of Dp and Dd.

FIG. 8C illustrates an example of a relative value $S/S_0$ with respect to a b-value in a tumor region based on the model values in FIG. 8A in a manner similar to FIG. 8B. As is clear from FIG. 8C, in a region where b-values are small, signal intensity $S/S_0$ of combined diffusion coefficient steeply changes due to strong influence of perfusion. Thus, when signal intensity corresponding to a large b-value such as b=2000 is computed by using b2=1000 and a small value of b1 such as b1=0, the computed value is expected to include a large error.

FIG. 9A to FIG. 9D are schematic diagrams illustrating relationship between a selection range of b-values and computation error of signal intensities. FIG. 9A illustrates ADC values computed by using the following formula (12) based on a single-exponential model, under the assumption that a combination of two b-values (b1, b2) is (0, 1000), (500, 1000), or (0, 2000).

$$S(b1)/S(b2)=\exp[-(b1-b2)*ADC] \quad \text{Formula (12)}$$

FIG. 9C illustrates relative signal intensity S corresponding to b=2000 computed by using ADC (0, 1000) and ADC (500, 1000) both of which are obtained by computation.

As is clear by comparing computed values of ADC and signal intensity with the correct value of ADC shown in FIG. 9B and the correct value of signal intensity shown in FIG. 9D, the error becomes large in the case of b1=0. On the other hand, the error becomes small in the case of b1=500.

Thus, when an ADC value is computed by using the formula (12) based on a single-exponential model, b1 is preferably set in such a manner that small values are excluded from b1 on the premise that b1<b2. For example, b1 is desirably set to a value which is 300[s/mm$^2$] or more by excluding b1=50 to 300[s/mm$^2$] or values lower than 50[s/mm$^2$].

Additionally or alternatively, an ADC value may be computed by using the following formulas (13) and (14) based on a bi-exponential model of a weighted average of two single-exponential models with the use of predetermined weighting coefficients f and (1−f), instead of the above-described single-exponential model. In this case, ADC1 and ADC2 are computed by using b-values (b=b1, b2, b3) of three points, and the smaller one of ADC1 and ADC2 is used for an ADC by which signal intensity is computed.

$$S(b2)/S(b1)=f*\exp[-(b2-b1)*ADC1]+(1-f)*\exp[-(b2-b1)*ADC2] \quad \text{Formula (13)}$$

$$S(b3)/S(b1)=f*\exp[-(b3-b1)*ADC1]+(1-f)*\exp[-(b3-b1)*ADC2] \quad \text{Formula (14)}$$

As examples of the three b-values, it may be set such that b1 is zero, b2 is 50 to 300 [s/mm$^2$], and b3 is around 1000[s/mm$^2$].

In the above-described manner, even if plural blood flows and plural diffusions are mixed, a computed diffusion-weighted image having a large contrast between a tumor region and a normal region can be generated.

Second Embodiment

The MRI apparatus 1 of the second embodiment further acquires a diffusion-weighted image whose repetition time TR is changed from other diffusion-weighted images, by performing four or more pulse sequences. For example, the MRI apparatus 1 acquires four diffusion-weighted images by performing the first to fourth pulse sequences. Then, a computed diffusion-weighted image corresponding to an arbitrary repetition time TRc, an arbitrary effective echo time TEc, and an arbitrary b-value (bc) is computed from those four diffusion-weighted images.

Figure 10:
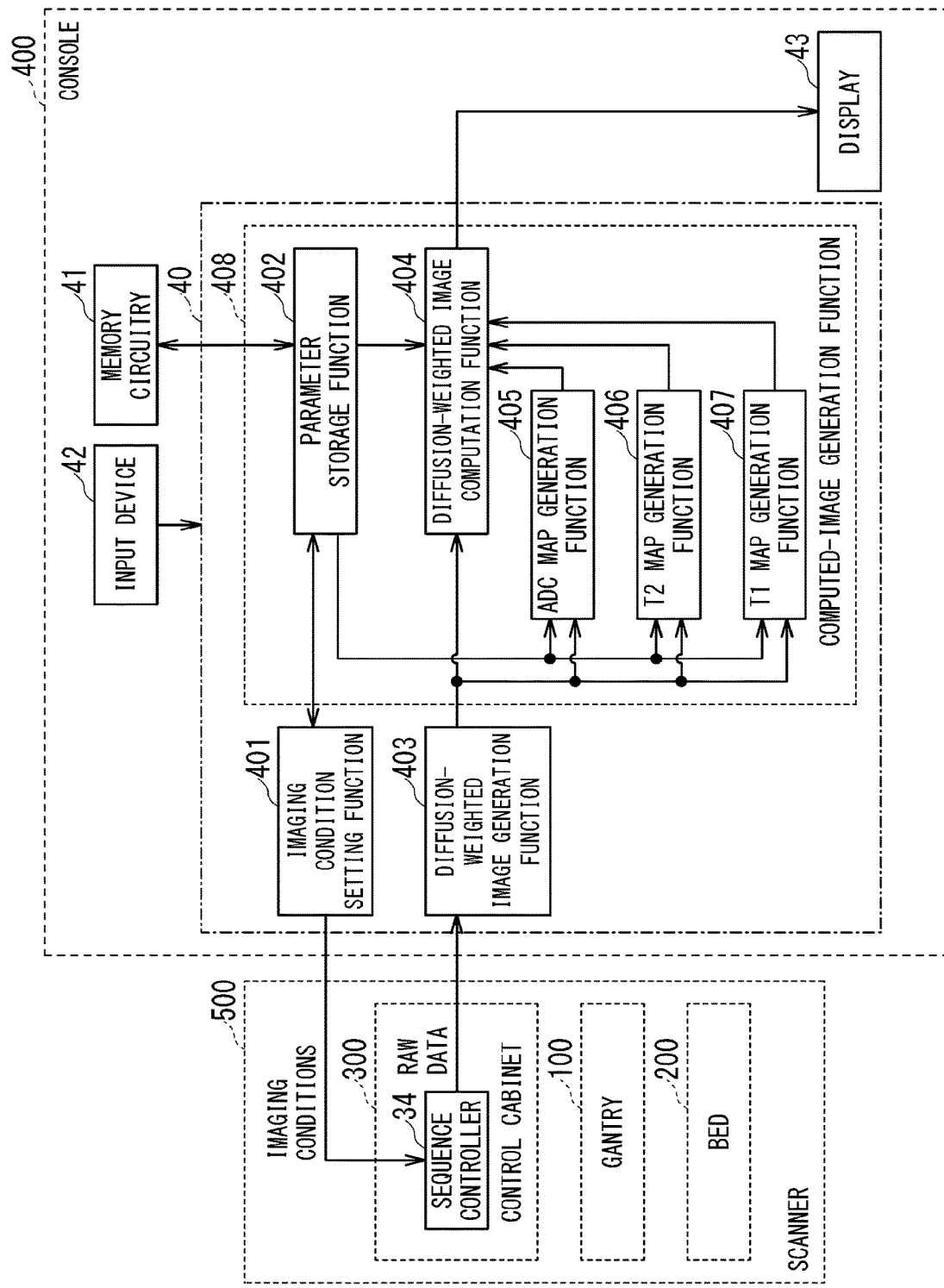
FIG. 10 is a functional block diagram illustrating an example of configuration relevant to DWI of the second embodiment.

FIG. 10 is a functional block diagram illustrating components relevant to DWI in the MRI apparatus 1 of the second embodiment. The difference between the first and second embodiments lies in that the MRI apparatus 1 of the second embodiment further includes a T1 map generation function 407.

Figure 11:
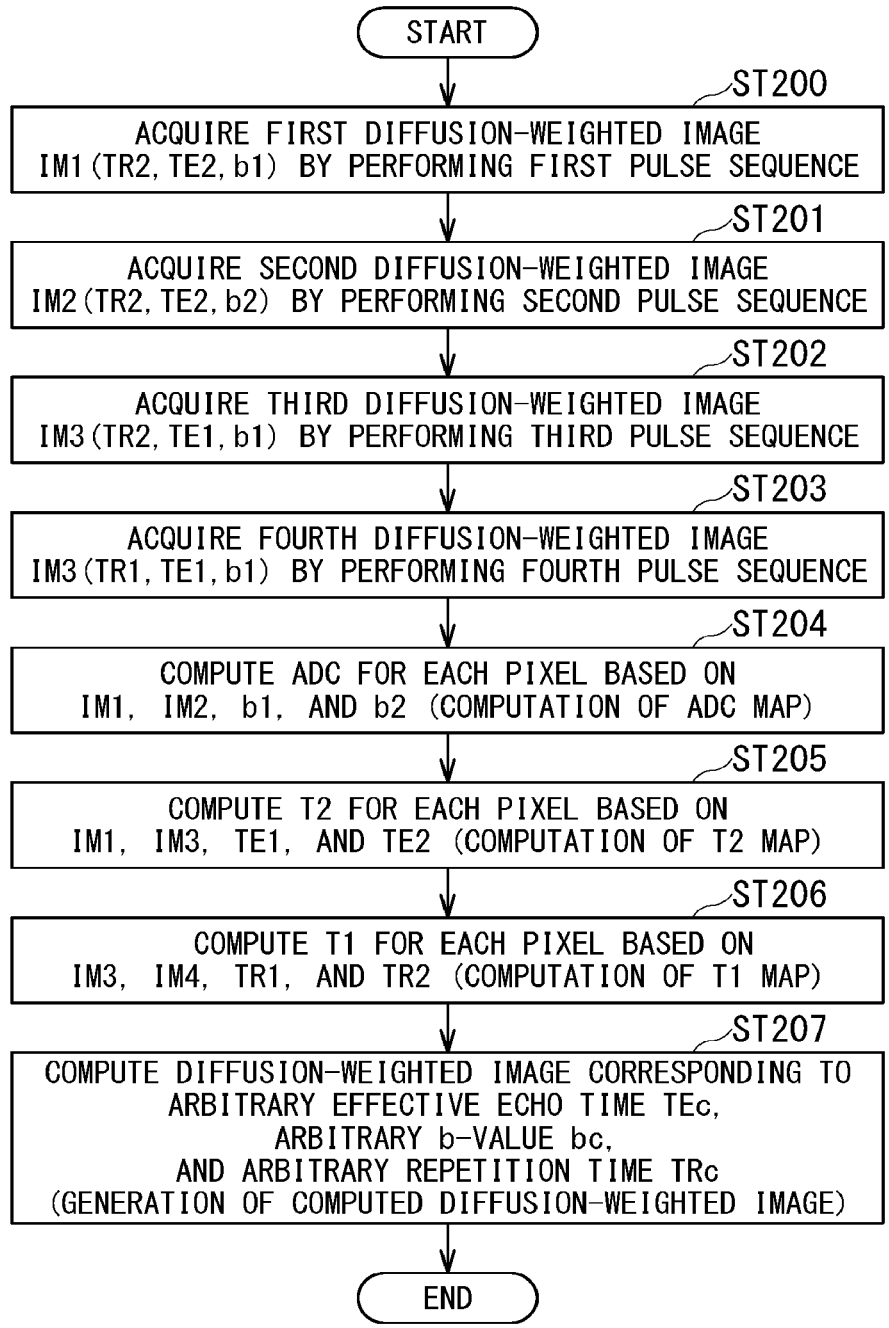
FIG. 11 is a flowchart illustrating an example of processing performed by the MRI apparatus of the second embodiment.

FIG. 11 is a flowchart illustrating an example of processing of generating a computed diffusion-weighted image performed by the MRI apparatus 1 of the second embodiment.

In the step ST200, the first diffusion-weighted image IM1(TR2, TE2, b1) is acquired by performing the first pulse sequence. While in the first embodiment, a computed diffusion-weighted image is generated by using two types of sequence parameter (i.e., an effective echo time TE and a b-value), in the second embodiment, three types of sequence parameter are used. In other words, a repetition time TR, an effective echo time TE, and a b-value are used for sequence parameters. Thus, it is described like a diffusion-weighted image IM(TR, TE, b), by taking the type of each of used sequence parameters as an argument.

In the next step ST201, the second diffusion-weighted image IM2 (TR2, TE2, b2) is similarly acquired by performing the second pulse sequence.

In the next step ST202, the third diffusion-weighted image IM3(TR2, TE1, b1) is similarly acquired by performing the third pulse sequence.

In the next step ST203, the fourth diffusion-weighted image IM4 (TR1, TE1, b1) is similarly acquired by performing the fourth pulse sequence. The processing of the steps ST200 to ST203 is performed by the MRI scanner 500 in a manner similar to the first embodiment.

Figure 12:
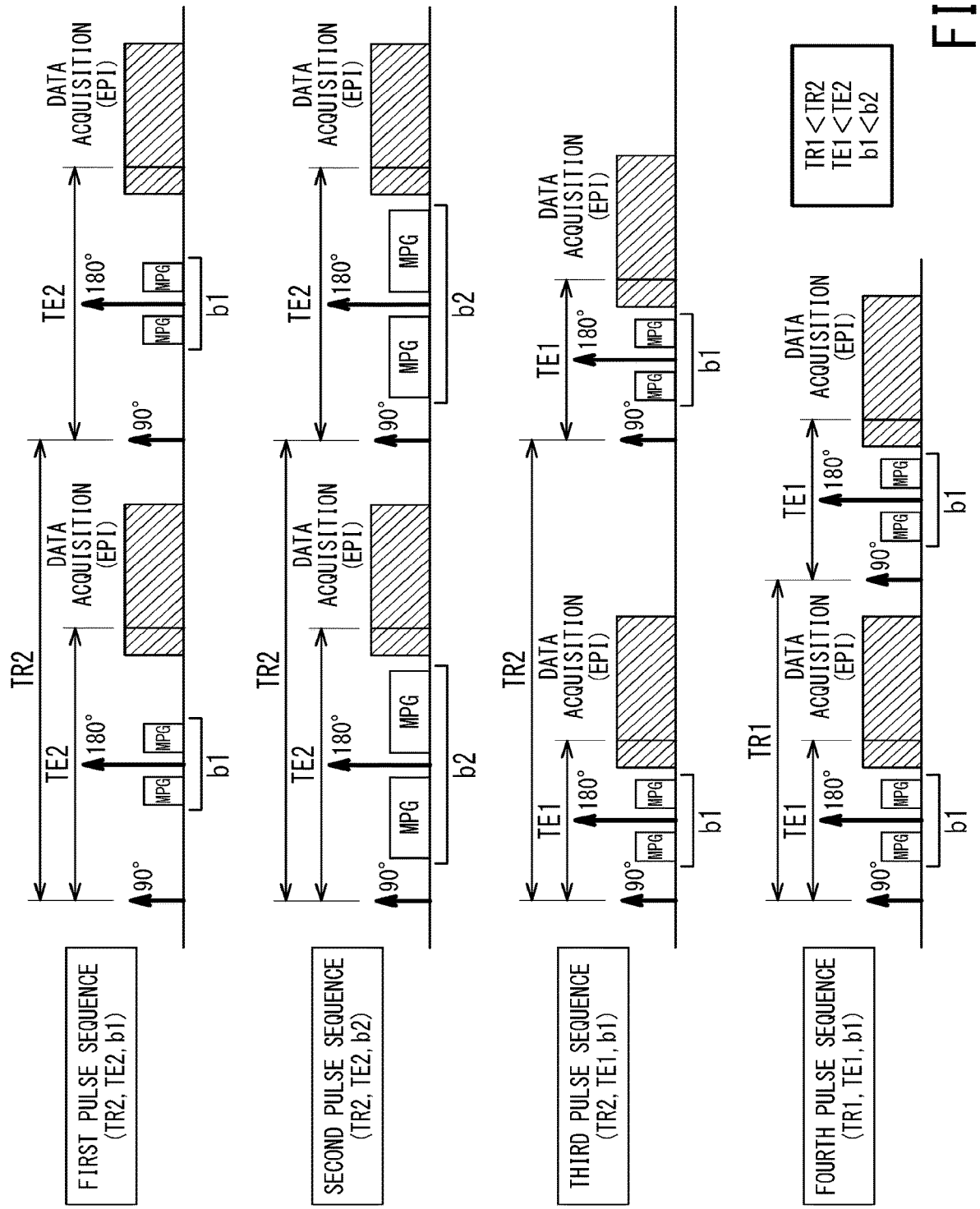
FIG. 12 is a timing chart illustrating examples of the first to fourth pulse sequences used in the second embodiment.

FIG. 12 is a timing chart illustrating examples of the first to fourth sequences used in the second embodiment. The first, second, and third pulse sequences shown in FIG. 12 are substantially the same as the first, second, and third pulse sequences of the first embodiment shown in FIG. 5, respectively. FIG. 12 shows that a repetition time is equal to TR2 through the first, second, and third pulse sequences.

On the other hand, in the fourth pulse sequence, while the same effective echo time TE1 and b-value b1 as the third pulse sequence are used, the repetition time TR1 which is different from the repetition time TR2 of the first to third pulse sequences is used. Specifically, the repetition time TR1 shorter than the repetition time TR2 of the first to third pulse sequences is used for the fourth pulse sequence.

In the second embodiment, DWI is executed by performing the above-described first, second, third, and fourth pulse sequences. Then, the diffusion-weighted image generation function 403 reconstructs the first, second, third, and fourth diffusion-weighted images IM1, IM2, IM3, and IM4 which respectively correspond to the first, second, third, and fourth pulse sequences. Here, signal intensity of each pixel of the first, second, third, and fourth diffusion-weighted images IM1, IM2, IM3, and IM4 are defined as S1 (TR2, TE2, b1), S2 (TR2, TE2, b2), S3 (TR2, TE1, b1), and S4(TR1, TE1, b1), respectively. These are given by the following formulas (15) to (18) on the basis of the formula (2).

$$S1(TR2,TE2,b1)=S_0*(1-\exp[-TR2/T1]*\exp[-TE2/T2]*\exp[-b1*ADC] \quad \text{Formula (15)}$$

$$S2(TR2,TE2,b2)=S_0*(1-\exp[-TR2/T1]*\exp[-TE2/T2]*\exp[-b2*ADC] \quad \text{Formula (16)}$$

$$S3(TR2,TE1,b1)=S_0*(1-\exp[-TR2/T1])*\exp[-TE1/T2]*\exp[-b1*ADC] \quad \text{Formula (17)}$$

$$S4(TR1,TE1,b1)=S_0*(1-\exp[-TR1/T1])*\exp[-TE1/T2]*\exp[-b1*ADC] \quad \text{Formula (18)}$$

Here, it is assumed that the repetition time TR1 is smaller than the repetition time TR2, the effective echo time TE1 is smaller than the effective echo time TE2, and the b-value b1 is smaller than the b-value b2.

Next, in the step ST204, an ADC value for each pixel is computed based on the first diffusion-weighted image IM1, the second diffusion-weighted image IM2, the b-value b1, and the b-value b2. Specifically, on the basis of the formulas (15) and (16), a signal intensity ratio given by the following formula (19) is computed.

$$S2(TR2,TE2,b2)/S1(TR2,TE2,b1)=\exp[-(b2-b1)*ADC] \quad \text{Formula (19)}$$

Then, an ADC value for each pixel given by the following formula (20), i.e., an ADC map is computed by the ADC map generation function 405.

$$ADC=-\ln [S2(TR2,TE2,b2)/S1(TR2,TE2,b1)]/(b2-b1) \quad \text{Formula (20)}$$

Next, in the step ST205, T2 values for respective pixels are computed based on the first diffusion-weighted image IM1, the third diffusion-weighted image IM3, the effective echo time TE1, and the effective echo time TE2. Specifically, on the basis of the formulas (15) and (17), a signal intensity ratio given by the following formula (21) is computed.

$$S1(TR2,TE2,b1)/S3(TR2,TE1,b1)=\exp[TE2-TE1]/T2] \quad \text{Formula (21)}$$

Then, a T2 value for each pixel given by the following formula (22), i.e., a T2 map is computed by the T2 map generation function 406.

$$T2=(TE2-TE1)/\ln [S1(TR2,TE2,b1)/S3(TR2,TE1,b1)] \quad \text{Formula (22)}$$

Next, in the step ST206, a longitudinal relaxation time T1 for each pixel is computed based on the third diffusion-weighted image IM3, the fourth diffusion-weighted image IM4, the repetition time TR1, and the repetition time TR2. Specifically, on the basis of the formulas (17) and (18), a signal intensity ratio given by the following formula (23) is computed.

$$S4(TR1,TE1,b1)/S3(TR2,TE1,b1)=(1-\exp[-TR1/T1])/(1-\exp[-TR2/T1]) \quad \text{Formula(23)}$$

A longitudinal relaxation time T1 for each pixel is computed by using the formula (23). Note that, though the above formula (23) cannot be analytically solved in this case, each longitudinal relaxation time T1 can be determined by using known numerical solution of nonlinear equations. A T1 map is a map in which a pixel value of each pixel is the value of the longitudinal relaxation time T1 computed for the pixel of the same position in a diffusion-weighted image. Computation of a longitudinal relaxation time T1 for each pixel is performed by the T1 map generation function 407.

When an ADC value, a T2 value, and a T1 value for each pixel is determined in the above manner, signal intensity Sc(TRc, TEc, bc) corresponding to an arbitrary repetition time TRc, an arbitrary effective echo time TEc, and an arbitrary b-value bc can be computed based on the following formula (24) by using any one of the formulas (15) to (18), for example, by using the formula (18).

$$Sc(TRc,TEc,bc)=S4*\{(1-\exp[-TRc/T1])/(1-\exp[-TR1/T1])\}*\exp[-(TEc-TE1)/T2]*\exp[-(bc-b1)*ADC] \quad \text{Formula (24)}$$

A computed diffusion-weighted image corresponding to an arbitrary repetition time TRc, an arbitrary effective echo time TEc, and an arbitrary b-value bc can be generated by computing signal intensity Sc(TRc, TEc, bc) for each pixel based on the formula (24).

When an arbitrary repetition time TRc is equal to the repetition time TR1, the formula (24) is simplified by the following formula (25).

$$Sc(TRc,TEc,bc)=S4*\exp[-(TEc-TE1)/T2]*\exp[-(bc-b1)*ADC] \quad \text{Formula (25)}$$

In this case, although four-point measurements (i.e., measurements of signal intensities S1 to S4) is necessary, computation of each longitudinal relaxation time T1 becomes unnecessary.

When an arbitrary repetition time TRc is equal to the repetition time TR1 and an arbitrary effective echo time TEc is equal to the effective echo time TE1, the formula (25) is further simplified by the following formula (26).

$$Sc(TRc, TEc, bc) = S4 * \exp[-(bc-b1) * ADC] \quad \text{Formula (26)}$$

In this case, it is enough to perform three-point measurements (i.e., measurements of signal intensities S1 to S3), and computation of each transverse relaxation time T2 as well as each longitudinal relaxation time T1 becomes unnecessary.

According to the above-described second embodiment, a computed diffusion-weighted image corresponding to an arbitrary repetition time TRc can be generated, in addition to effects of the first embodiment. Thus, a diffusion-weighted image corresponding to such a short repetition time TRc as to be unable to achieve in an actual pulse sequence can be computed. As a result, more appropriately T1-weighted computed diffusion-weighted image than that acquired by conventional DWI can be generated.

Incidentally, magnitude relation of sequence parameters (TE, b-value) described under the title of "Magnitude Relation of Sequence Parameter" in the first embodiment holds true for the sequence parameters (TR, TE, b-value) in the second embodiment.

Modification of Second Embodiment

In the above-described second embodiment, three tissue parameters (i.e., a longitudinal relaxation time T1, a transverse relaxation time T2, and an ADC) are computed based on signal intensity of four points (i.e., S1(TR2, TE2, b1), S2(TR2, TE2, b2), S3(TR2,TE1, b1), and S4(TR1, TE1, b1)), and a diffusion-weighted image corresponding to three sequence parameters having arbitrary values (i.e., an arbitrary repetition time TRc, an arbitrary effective echo time TEc, and an arbitrary b-value bc) is computed by using these three tissue parameters.

On the other hand, in the modification of the second embodiment, each b-value is fixed to b1 (b=b1>0), two tissue parameters (i.e., a longitudinal relaxation time T1 and a transverse relaxation time T2) are computed from signal intensity of three points, and a diffusion-weighted image corresponding to an arbitrary repetition time TRc, an arbitrary effective echo time TEc, and a predetermined b-value b1 is computed by using these two tissue parameters. Specifically, the longitudinal relaxation time T1 and the transverse relaxation time T2 are computed based on the above-described formulas (15), (17), and (18). Then, the diffusion-weighted image of signal intensity Sc (TRc, TEc, b1) corresponding to an arbitrary repetition time TRc, an arbitrary effective echo time TEc, and the predetermined b-value b1 is computed based on the following formula (27).

$$Sc(TRc, TEc, b1) = S4 * \{(1-\exp[-TRc/T1])/(1-\exp[-TR1/T1])\} * \exp[-(TEc-TE1)/T2] \quad \text{Formula (27)}$$

Third Embodiment

In the first embodiment, a diffusion-weighted image corresponding to arbitrary values of respective two types of parameters (i.e., an arbitrary effective echo time TEc and an arbitrary b-value bc) is computed based on three-point measurements. Additionally, in the second embodiment, a diffusion-weighted image corresponding to arbitrary values of respective three types of parameters (i.e., an arbitrary repetition time TRc, an arbitrary effective echo time TEc, and an arbitrary b-value bc) is computed based on four-point measurements. Further, in the modification of the second embodiment, a diffusion-weighted image corresponding to arbitrary values of respective two types of parameters (i.e., an arbitrary repetition time TRc and an arbitrary effective echo time TEc) is computed based on three-point measurements.

In the third embodiment, a diffusion-weighted image corresponding to an arbitrary value of one type of parameter (e.g., an arbitrary effective echo time TEc) is computed based on two-point measurements.

Here, two-point measurements means to acquire the first and second diffusion-weighted images by performing the first and second pulse sequences.

In the third embodiment, the same b-value b1 larger than zero and the same repetition time TR2 are commonly used for the first and second pulse sequences, whereas the first and second pulse sequences are different ineffective echo time TE from each other. Specifically, the effective echo time of the first pulse sequence is set to TE2 and the effective echo time of the second pulse sequence is set to TE1, on the premise that TE1 is smaller than TE2.

In this case, the ratio of signal intensity S1(TR2, TE2, b1) of the first diffusion-weighted image to signal intensity S2(TR2, TE1, b1) of the second diffusion-weighted image is given by the following formula (28).

$$S1(TR2,TE2,b1)/S2(TR2,TE1,b1) = \exp[-(TE2-TE1)/T2] \quad \text{Formula (28)}$$

On the basis of the formula (28), the transverse relaxation time T2 can be computed by the formula following formula (29).

$$T2 = -(TE2-TE1)/\ln[S1(TR2,TE2,b1)/S2(TR2,TE1,b1)] \quad \text{Formula (29)}$$

Then, signal intensity Sc(TR2, TEc, b1) corresponding to an arbitrary effective echo time TEc, a predetermined b-value b1, and a predetermined repetition time TR2 can be computed by substituting the computed transverse relaxation time T2 into the following formula (30).

$$Sc(TR2,TEc,b1) = S2(TR2,TE1,b1) * \exp[-(TEc-TE1)/T2] \quad \text{Formula (30)}$$

Although the b-value in the third embodiment is the same as the value used for the measurement, the effective echo time TEc can be arbitrarily set in the third embodiment. Thus, by setting an arbitrarily effective echo time TEc to be smaller than the effective echo time TE1 (TEc<TE1), a diffusion-weighted image corresponding to an extremely short effective echo time TEc can be computed. As a result, a diffusion-weighted image which reflects low attenuation of a transverse relaxation time T2 and strong intensity of MR signals can be obtained for a tissue having a short transverse relaxation time T2.

Modification of Third Embodiment

In the modification of the third embodiment, the same b-value b1 larger than zero and the same effective echo time TE2 are commonly used for the first and second pulse sequences, whereas the first and second pulse sequences are different in repetition time TR from each other. Specifically, the repetition time of the first pulse sequence is set to TR2 and the repetition time of the second pulse sequence is set to TR1, on the premise that the repetition time TR TR1 is smaller than the repetition time TR TR2. Then, each longitudinal relaxation time T1 is computed based on signal intensity S1 (TR2, TE2, b1) of the first pulse sequence and signal intensity S2 (TR1, TE2, b1) of the second pulse sequence. Moreover, signal intensity Sc(TRc, TE2, b1)

corresponding to an arbitrary repetition time TRc, the predetermined b-value b1, and the predetermined effective echo time TE2 can be computed from the following formula (31), by using the computed longitudinal relaxation time T1.

$$Sc(TRc,TE2,b1)=S1(TR2,TE2,b1)*(1-\exp[-TRc/T1])/ \\ (1-\exp[-TR2/T1]) \quad \text{Formula(31)}$$

In the first embodiment as described above, three-point measurements (i.e., acquisition of three signal intensities S1, S2, and S3) are performed in order to determine two types of unknown parameters ADC and T2. In addition, in the second embodiment, four-point measurements (i.e., acquisition of four signal intensities S1, S2, S3, and S4) are performed in order to determine three types of unknown parameters T1, T2, and ADC. Further, in the third embodiment, two-point measurements (i.e., acquisition of two signal intensities S1 and S2) are performed in order to determine one type of unknown parameter T2.

As is clear from the above examples, in order to determine N types of unknown parameters, it is enough to perform (N+1)-point measurements. Thus, when unknown parameters other than a longitudinal relaxation time T1, a transverse relaxation time T2, and an ADC are needed, the above-described method can be easily extended so as to determine such unknown parameters by performing measurements at necessary points.

Although at least N+1 measurement points are necessary for determining N types of unknown parameters, number of measurement points may be larger than N+1. In this case, N types of unknown parameters can be determined by applying a maximum likelihood estimation method to data of measurement points whose number is larger than N+1, and such a computation method becomes robust to errors of measurement.

According to the MRI apparatus 1 of each of the embodiments as described above, even if an effective echo time TE in a pulse sequence of actual DWI is restricted (e.g., even if an effective echo time TE cannot be so shortly set due to insertion of MPG pulses), a diffusion-weighted image corresponding to an arbitrary effective echo time TEc (e.g., an extremely short effective echo time TEc) can be computed. Thus, a tissue having a short transverse relaxation time T2 such as a tumor and a nerve can be distinctly depicted with strong signal intensity due to low attenuation of transverse relaxation Additionally, since a diffusion-weighted image corresponding to an arbitrary repetition time TRc (e.g., an extremely short repetition time TRc) can be computed, a T1-enhanced diffusion-weighted image can be easily generated.

To be further generalized, the MRI apparatus 1 of each embodiment acquires N+1 or more diffusion-weighted images by differently setting parameter values among the diffusion-weighted images, with regard to N types of parameters, wherein N is a natural number equal to or more than two. Here, the N types of parameters, the parameter values of which are set differently among the diffusion-weighted images, include at least one of diffusion-enhancing factor b-value, an effective echo time TE, and a repetition time TR.

Then, MRI apparatus 1 of each embodiment generates a computed diffusion-weighted image having an arbitrary value for at least one of the N types of parameters, based on relationship between signal values of the acquired diffusion-weighted images and the parameter values differently set among the acquired diffusion-weighted images.

Fourth Embodiment

In each of the above-described embodiments, the generation methods of a computed diffusion-weighted image based on an SE (Spin Echo) type sequence have been mainly described. On the other hand, in the fourth embodiment as described below, the generation methods of a computed diffusion-weighted image are applied to an imaging method in which longitudinal magnetization is inversed by applying an inversion recovery pulse (hereinafter, referred to as an IR pulse) and MR signals are acquired under the SE type sequence in the middle of a recovering process of longitudinal magnetization due to longitudinal relaxation. Hereinafter, an imaging method without using an IR pulse is simply referred to as an SE method, and the above-described imaging method with the use of IR pulses is referred to as an IR method.

In an IR method, the time interval from an application timing of an IR pulse to an application timing of an excitation pulse (e.g., a 90° pulse) is referred to as a TI (Inversion Time).

Out of various types of IR methods, an FLAIR method is known as an imaging method of suppressing MR signals emitted from CSF (CerebroSpinal Fluid). In the FLAIR method, a TI is set so that acquisition of an MR signal is performed at the timing when longitudinal magnetization of CSF inversed to a negative value by an IR pulse recovers to zero.

Even if a b-value is zero, a diffusion-weighted image acquired by the FLAIR method is useful because MR signals from CSF are sufficiently suppressed. However, compared with a diffusion-weighted image acquired by an SE method, a diffusion-weighted image acquired by the FLAIR method has a disadvantage that SNR (Signal to Noise Ratio) is low for the following reason. When a TI is set so that longitudinal magnetization of CSF becomes zero at the posterior end of a TI, longitudinal magnetization of cerebral parenchyma such as gray substance and white matter is still in the middle of the recovering process and strength of longitudinal magnetization of cerebral parenchyma is 70% to 80% of its saturated longitudinal magnetization at the posterior end of a TI. Thus, when the FLAIR method is used for actual acquisition of MR signals, its SNR becomes lower than the case of using an SE method having the same effective echo time TE.

In addition, when a b-value is added to the FLAIR method, i.e., a diffusion-weighted image is generated by applying the FLAIR method to actual acquisition of MR signals, its SNR further decreases. Although actual acquisition of MR signals under the FLAIR method has an advantage that MR signals from CSF are suppressed regardless of a b-value, an SNR in cerebral parenchyma also decreases in this method. In particular, the stronger strength of a static magnetic field is, the longer the longitudinal relaxation time T1 becomes, which lowers an SNR. Thus, in actual acquisition of MR signals, DWI using the FLAIR method is not prevalent.

By contrast, according to the fourth embodiment as described below, a diffusion-weighted image with the use of the FLAIR method can be obtained by computation. In particular, an SNR higher than actual acquisition of MR signals can be achieved by computation of a diffusion-weighted image using the FLAIR method.

Figure 13:
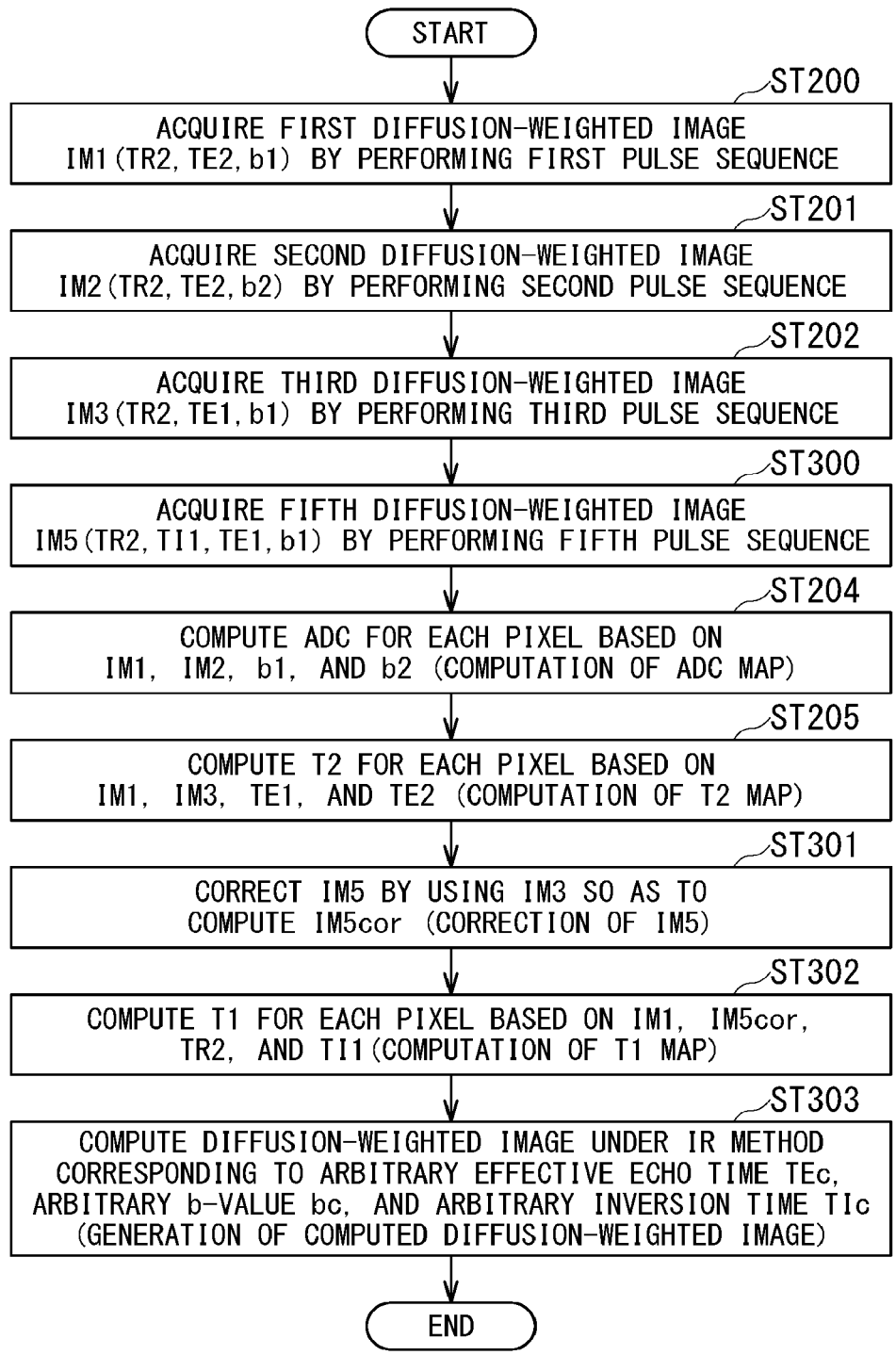
FIG. 13 is a flowchart illustrating an example of processing performed by the MRI apparatus of the fourth embodiment.

FIG. 13 is a flowchart illustrating an example of processing of generating a computed diffusion-weighted image performed by the MRI apparatus 1 of the fourth embodiment. In the fourth embodiment, four-point measurements are performed in order to determine three unknown parameters (e.g., T1, T2, and ADC) in a manner similar to the second embodiment. However, a method of commuting the longitudinal relaxation time T1 is different between the second and fourth embodiments.

In the second embodiment, the fourth diffusion-weighted image IM4 (TR1, TE1, b1) is acquired by performing the fourth pulse sequence under an SE method in order to determine each longitudinal relaxation time T1, and then a T1 map is computed based on the fourth diffusion-weighted image IM4 and the third diffusion-weighted image IM3 in the step ST206 of FIG. 11. On the other hand, in the fourth embodiment, the fifth diffusion-weighted image IM5 (TR2, TI1, TE1, b1) is acquired by performing the fifth pulse sequence under the IR method in the step ST300 of FIG. 13. In FIG. 13, processing of each of the steps ST200, ST201, ST202, ST204, and ST205 is the same as that of the second embodiment.

Figure 14:
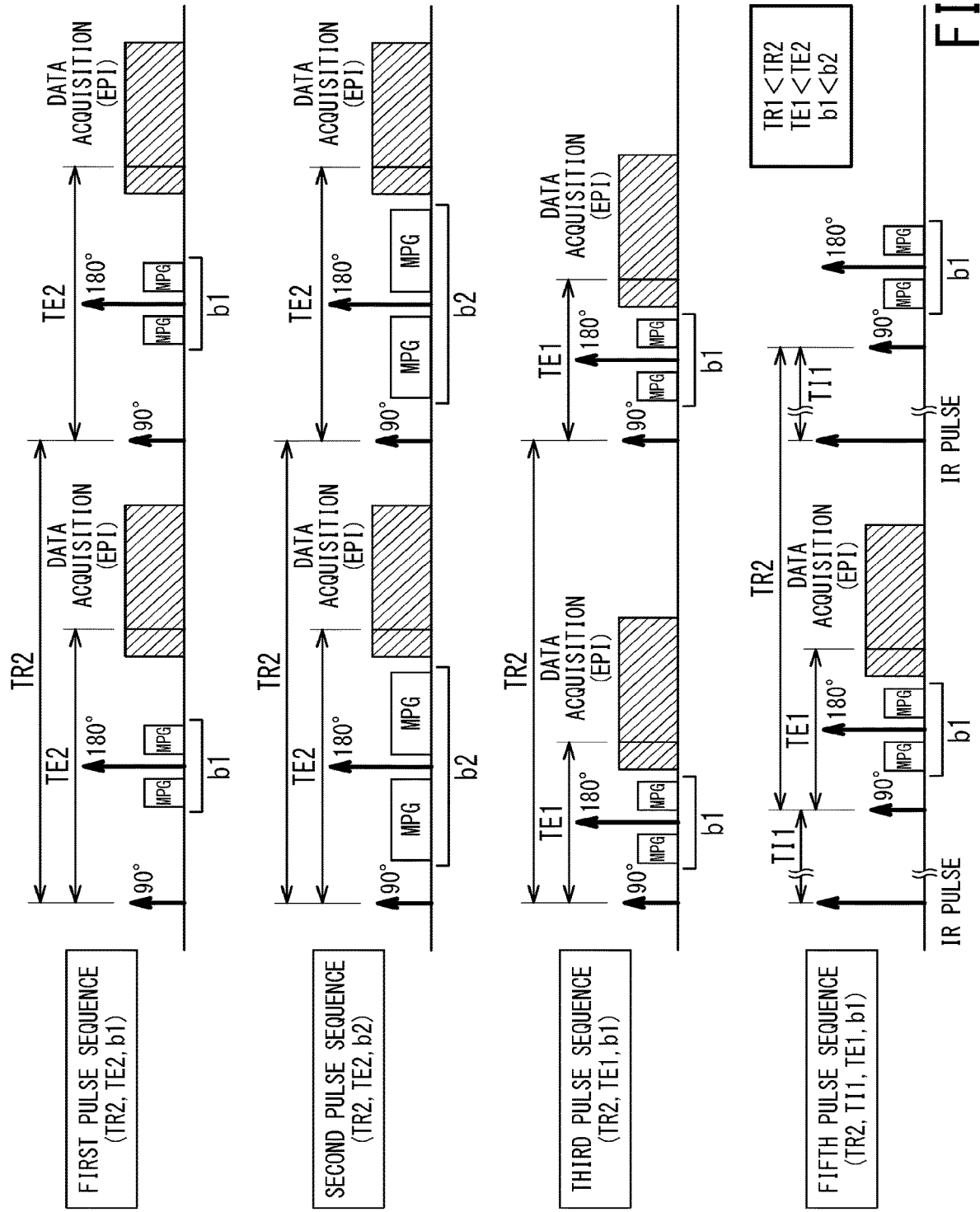
FIG. 14 is a timing chart illustrating four pulse sequences used in the fourth embodiment.

FIG. 14 is a timing chart illustrating four pulse sequences used in the fourth embodiment. The first, second, and third pulse sequences shown in FIG. 14 are respectively used for measurements of the first, second, and third points. The first, second, and third pulse sequences shown in FIG. 14 are pulse sequences of an SE method without using IR pulse, and are substantially the same as the first, second, and third pulse sequences of the second embodiment shown in FIG. 12, respectively.

On the other hand, the fifth pulse sequence used for measurement of the fourth point shown in the bottom part of FIG. 14 is a pulse sequence of the IR method in which IR pulses are used, and its inversion time is noted as TI1 in FIG. 14. The fifth diffusion-weighted image IM5 is acquired by performing the fifth pulse sequence.

Here, signal intensity of each pixel of the fifth diffusion-weighted image IM5 is defined as S5. Since signal intensity S5 is acquired under the IR method and is different from signal intensity S1, S2, and S3 acquired under an SE method, it is necessary to reflect sign information in signal intensity S5. In other words, phase-sensitive IR (PSIR) i.e., extraction of real part is required, and thus, phase correction is necessary. This phase correction is performed in the step ST301 of FIG. 13 by applying the following formula (32) with the use of a complex signal of the third diffusion-weighted image IM3 to be acquired in parallel.

$$S5cor=S5*(conj[S3]/|S3|) \qquad \text{Formula(32)}$$

Here, both of S3 and S5 are complex signals, and conj[ ] in the formula (32) means to take a complex conjugate. "S5cor" in the formula (32) is signal intensity of each pixel of the fifth diffusion-weighted image IM5 subjected to phase correction (i.e., a value with sign of each pixel of a real part image) and is indicated by the following formula (33).

$$S5cor=S_0*(1-2*exp[-TI1/T1])*exp[-TE1/T2]*exp[-b1*ADC] \qquad \text{Formula (33)}$$

Next, on the basis of S5cor determined by the formula (33) and amplitude (i.e., absolute value) of signal intensity IS31 of each pixel of the third diffusion-weighted image IM3 determined by the formula (17), each longitudinal relaxation time T1 is computed by the following formula (34).

$$S5cor/|S3|=(1-2*exp[-TI1/T1])/(1-exp[-TR2/T1]) \qquad \text{Formula (34)}$$

The longitudinal relaxation time T1 in the formula (34) cannot be analytically solved and is required to be determined by applying numerical solution of nonlinear equations such as the Marcart method. In general, the repetition time TR2 is five times larger than the longitudinal relaxation time T1 (i.e., TR2>5*T1), and TR2 can be regarded as sufficiently larger than T1. In this case, the formula (34) can be simplified by the following formula (35).

$$S5cor/|S3|=(1-2*exp[-TI1/T1]) \qquad \text{Formula(35)}$$

On the basis of the formula (35), each longitudinal relaxation time T1 (i.e., a T1 map) can be approximately computed by the following formula (36) (in the step ST302 of FIG. 13).

$$T1=-TI1/\ln[(1-S5cor/|S3|)/2] \qquad \text{Formula (36)}$$

Figure 15A:
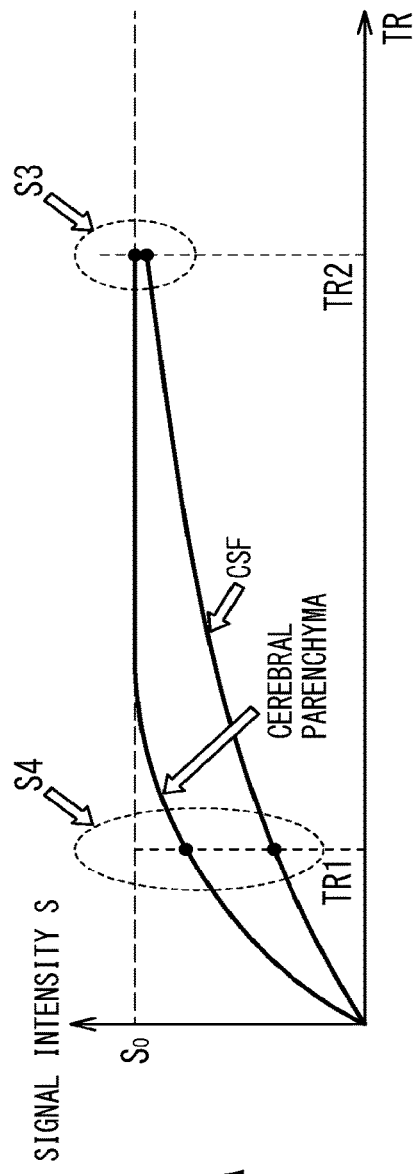
FIG. 15A is a timing chart illustrating conditions for T1-measurement points under an SE (Spin Echo) method of the second embodiment in the case of imaging a brain.
Figure 15B:
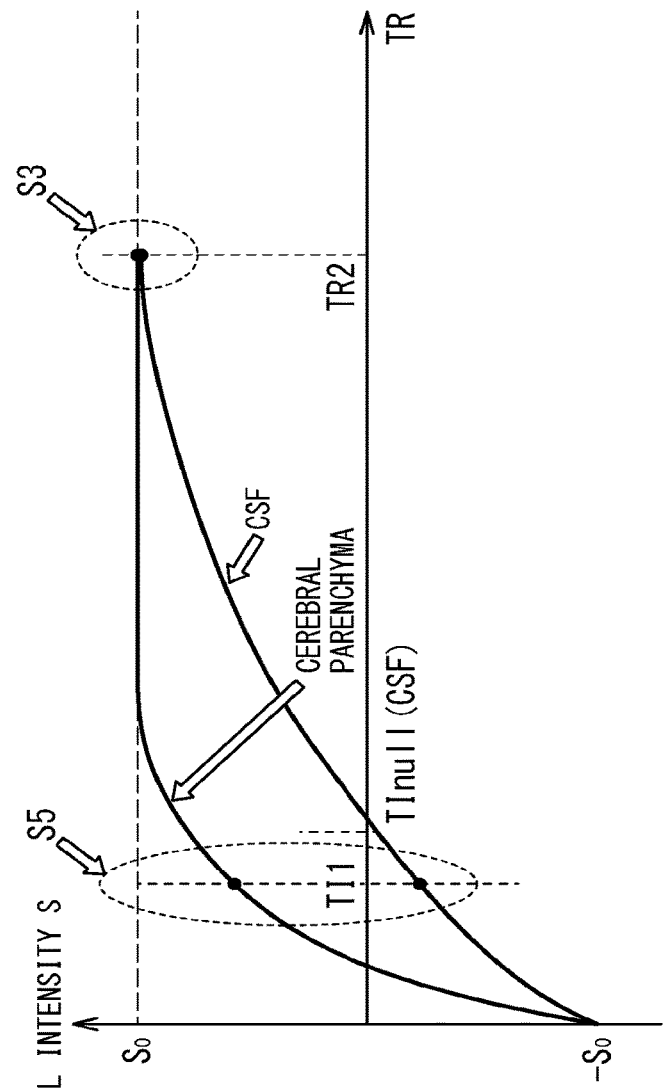
FIG. 15B is a timing chart illustrating conditions for T1-measurement points under the IR method of the fourth embodiment in the case of imaging a brain.

FIG. 15A is a timing chart illustrating conditions for T1-measurement points under an SE method of the second embodiment in the case of imaging a brain. FIG. 15B is a timing chart illustrating conditions for T1-measurement points under the IR method of the fourth embodiment in the case of imaging a brain.

As shown in FIG. 15A, in an SE method, the repetition time TR2 for the sequence part of acquiring the third diffusion-weighted image IM3 (S3) is set to a sufficiently long value so that CSF with a long longitudinal relaxation time T1 is substantially saturated at the timing when each MR signal is detected. In processing of receiving MR signals for the fourth diffusion-weighted image IM4 (S4), a CNR (Contrast to Noise Ratio) of cerebral parenchyma can be enhanced by setting the repetition time TR1 to a value close to a longitudinal relaxation time T1 of cerebral parenchyma such as gray substance and white matter.

In the IR method, as shown in FIG. 15B, the repetition time TR2 for the sequence part of acquiring the fifth diffusion-weighted image IM5 is also set to a sufficiently long value in a manner similar to the above-described acquisition of MR signals for the third diffusion-weighted image IM3. That is, in the IR method, the repetition time TR2 for the fifth diffusion-weighted image IM5 is set to a sufficiently long value so that CSF with a long longitudinal relaxation time T1 is substantially saturated at the timing when each MR signal is detected. Meanwhile, in acquiring MR signals for the fifth diffusion-weighted image IM5 under the IR method, an CNR of cerebral parenchyma can be enhanced by setting the inversion time TI1 to a value close to a longitudinal relaxation time T1 of cerebral parenchyma such as gray substance and white matter.

Returning to FIG. 13, in the step ST303, signal intensity Sc (TIc, TEc, bc) corresponding to an arbitrary inversion time TIc, an arbitrary effective echo time TEc, and an arbitrary b-value bc is computed by applying the following formula (37).

$$Sc(TIc,TEc,bc)=S1*(1-2*exp[-TIc/T1])*exp[-(TEc-TE1)/T2]*exp[-(bc-b1)*ADC] \qquad \text{Formula (37)}$$

In the formula (37), it is assumed that the repetition time TR2 is sufficiently larger than an arbitrary inversion time TIc.

Here, when an arbitrary inversion time TIc is equal to the inversion time TI1 (TIc=TI1) and an arbitrary effective echo time TEc is smaller than the effective echo time TE1 (TEc<TE1), the formula (37) can be simplified by the following formula (38).

$$Sc(TI1,TEc,bc)=S5cor*exp[-(TEc-TE1)/T2]*exp[-(bc-b1)*ADC] \qquad \text{Formula (38)}$$

In this case, while measurements of at least four points are required, computation of each longitudinal relaxation time T1 is unnecessary.

When an arbitrary inversion time TIc is equal to the inversion time TI1 (TIc=TI1) and an arbitrary effective echo time TEc is equal to the effective echo time TE1 (TEc=TE1), the formula (38) can be further simplified by the following formula (39).

$$Sc(TI1,TE1,bc)=S5cor*exp[-(bc-b1)*ADC] \qquad \text{Formula (39)}$$

In this case, computation of each longitudinal relaxation time T1 and each transverse relaxation time T2 becomes unnecessary and signal intensity Sc (TI1, TE1, bc) can be computed by performing measurements of at least three points.

A method of computing each longitudinal relaxation time T1 (i.e., a T1 map) under the four-point method is especially effective for generation of a computed diffusion-weighted image under the FLAIR method. In the FLAIR method, a T2-weighted image is generally generated by causing MR signals from CSF to become almost zero even in the case where the b-value is zero. In order to cause MR signals from CSF to become almost zero, it is enough to set an arbitrary inversion time TIc to a value equal to or smaller than TInull(CSF), where TInull (CSF) indicates the inversion time TI at which longitudinal magnetization of CSF becomes zero. Since a sign of each pixel value can be depicted on a computed image, an arbitrary inversion time TIc is not necessarily needed to be strictly equal to TInull (CSF) but an arbitrary inversion time TIc may be slightly smaller than TInull (CSF).

Even when the T1 map is generated under an SE method according to the second embodiment, its SNR becomes higher than an actually measured FLAIR image, if the repetition time TR1 is set to the optimum value for the cerebral parenchyma (i.e., if TR1 is set to a value equal to T1 of cerebral parenchyma). However, according to the above-described fourth embodiment, the SNR of the T1 map can be further enhanced to two times of that of an SE method, by generating a T1 map under the IR method.

Modification of Fourth Embodiment

In the FLAIR method, a computed diffusion-weighted image whose b-value is different from any b-value used in the actual acquisition of MR signals can be generated from the actually acquired diffusion-weighted images, which are acquired by using at least two different b-values under conditions where parameters other than the b-value are set to be equal. A known computed DWI technique is implicitly limited to an SE method, and a combination of a computed DWI technique and the FLAIR method has not been proposed (hereinafter, computed diffusion weighted imaging may be shortly referred to as cDWI). For this reason, in the modification of the fourth embodiment, the combination of the cDWI and the FLAIR method is proposed as "FLAIR-cDWI" of a two-point method. In the FLAIR-cDWI of a two-point method, an effective echo time TE cannot be set to a shot value but MR signals from CSF are caused to become close to zero. Thus, there is a high possibility that a b-value in the FLAIR-cDWI of a two-point method can be set to a value smaller than a b-value of SE-cDWI in which a b-value is required to be a large value for suppressing a T2 shine-through effect caused by CSF. Here, "SE-cDWI" indicates a combination of the cDWI and the SE method.

To be generalized, in an imaging method using an IR pulse, the MRI apparatus of each of the fourth embodiment and its modification, acquires N+1 or more diffusion-weighted images by differently setting parameter values among the diffusion-weighted images, with regard to N types of parameters, wherein N is a natural number equal to or more than one.

Then, MRI apparatus of each of the fourth embodiment and its modification generates a computed diffusion-weighted image having an arbitrary value for at least one of the N types of parameters, based on relationship between signal values of the acquired diffusion-weighted images and the parameter values differently set among the acquired diffusion-weighted images.

FIG. 16 is a schematic diagram illustrating an example of a screen for setting parameters for acquisition of diffusion-weighted images in the above-described first to fourth embodiments. In the second embodiment, for example, before a total of four images, i.e., the first to fourth diffusion-weighted images IM1, IM2, IM3, and IM4 are acquired, it is required to set each b-value, each effective echo time TE, and each repetition time TR as parameters used in acquisition of MR signals. In the fourth embodiment as another example, before a total of four images, i.e., the first to third diffusion-weighted images IM1, IM2, and IM3 and the fifth diffusion-weighted image IM5 are acquired, it is required to set an inversion time TI in addition to each b-value, each effective echo time TE, and each repetition time TR as parameters used in acquisition of MR signals for the fifth diffusion-weighted image IM5.

Recommended values for these parameters are preliminarily stored in the memory circuitry 41 and are displayed in a screen of the display 43 for setting parameters. Operation burden on a user is reduced by displaying those recommended values. When a user wants to change a recommended value, a user may click a button mark (e.g., a black triangle in the case of FIG. 16) adjacent to the parameter value window and select another value from a pull-down menu, for example. Additionally or alternatively, a user may directly input a desired value from a keyboard of the input device 42. When setting of respective parameters is completed, selected values are determined as values of the respective parameter by clicking the "SET" button on the bottom right of the screen.

Fifth Embodiment

Figure 17:
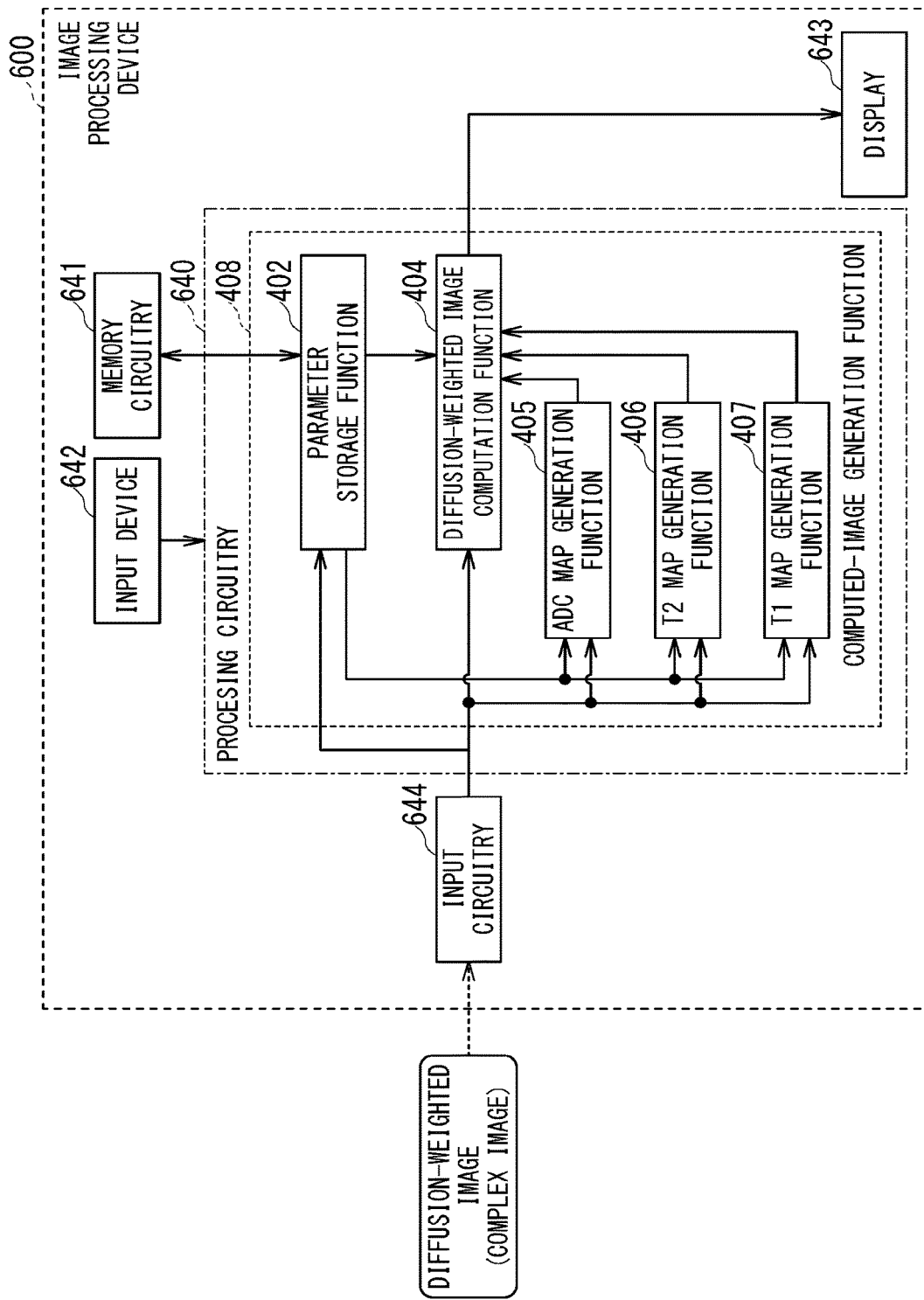
FIG. 17 is a block diagram illustrating an example of configuration of an image processing device of the fifth embodiment.

FIG. 17 is a block diagram illustrating an example of configuration of an image processing device 600 of the fifth embodiment. The above-described first to fourth embodiments relate to aspects of the MRI apparatus 1, and the MRI apparatus 1 of each of the first to fourth embodiments includes components for acquiring data (i.e., MR signals) of diffusion-weighted images such as the gantry 100, the bed 200, and the control cabinet 300. On the other hand, the image processing device 600 of the fifth embodiment does not include such a component for acquiring image data. The image processing device 600 is configured as a computer like a workstation, for example.

The image processing device 600 includes processing circuitry 640, memory circuitry 641, an input device 642, a display 643, and input circuitry 644. The processing circuitry 640, the memory circuitry 641, the input device 642, and the display 643 are substantially the same as the processing circuitry 40, the memory circuitry 41, the input device 42, and the display 43 described in the first embodiment, respectively. Thus, duplicate description is omitted.

In addition, functions implemented by the processing circuitry 640 are the same as the functions implemented by the processing circuitry 40 except an imaging condition setting function 401 and a diffusion-weighted image generation function 403.

The input circuitry 644 receives input of data of diffusion-weighted images imaged by an MRI apparatus which is an apparatus independent of the image processing device 600.

When data of a diffusion-weighted image are inputted via a communication line such as a LAN (Local Area Network) and the internet, the input circuitry 644 is configured as a communication interface compatible with communication standards of the respective communication line. In addition, when data of a diffusion-weighted image are inputted via a memory medium such as an optical disc, the memory circuitry 641 is configured as a reading device of a memory medium.

Diffusion-weighted images inputted to the input circuitry 644 are, for example, diffusion-weighted images corresponding to the above-described first to fifth diffusion-weighted images IM1, IM2, IM3, IM4, and IM5. Since the fifth diffusion-weighted image IM5 imaged under the IR method is required to be subjected to phase correction using, for example, the third diffusion-weighted image IM3 as described in the fourth embodiment, at least each of the third and fifth diffusion-weighted images IM3 and IM5 needs to be a complex image in which phase components of respective pixels are maintained.

Data of each of diffusion-weighted images to be inputted to the input circuitry 644 include imaging conditions at the time of imaging as accompanying information in addition to pixel data of the image. This accompanying information includes parameter values such as a specific b-value, a repetition time TR, an effective echo time TE, and an inversion time TI, actually used when imaging the inputted images.

The processing circuitry 640 performs processing corresponding to each of the above-described embodiments based on the inputted data of diffusion-weighted images and their accompanying information so as to generate a computed diffusion-weighted image. For example, the processing circuitry 640 generates a computed diffusion-weighted image by performing processing of the steps ST103 to ST105 in FIG. 3, processing of the steps ST204 to ST207 in FIG. 11, or processing of the steps ST204 to ST303 in FIG. 13.

Although a computed diffusion-weighted image can be computed with respect to an arbitrary b-value, an arbitrary effective echo time TE, an arbitrary repetition time TR, and an arbitrary inversion time TI, it is necessary on a user side to set arbitrary values of these parameters prior to the computation.

Figure 18:
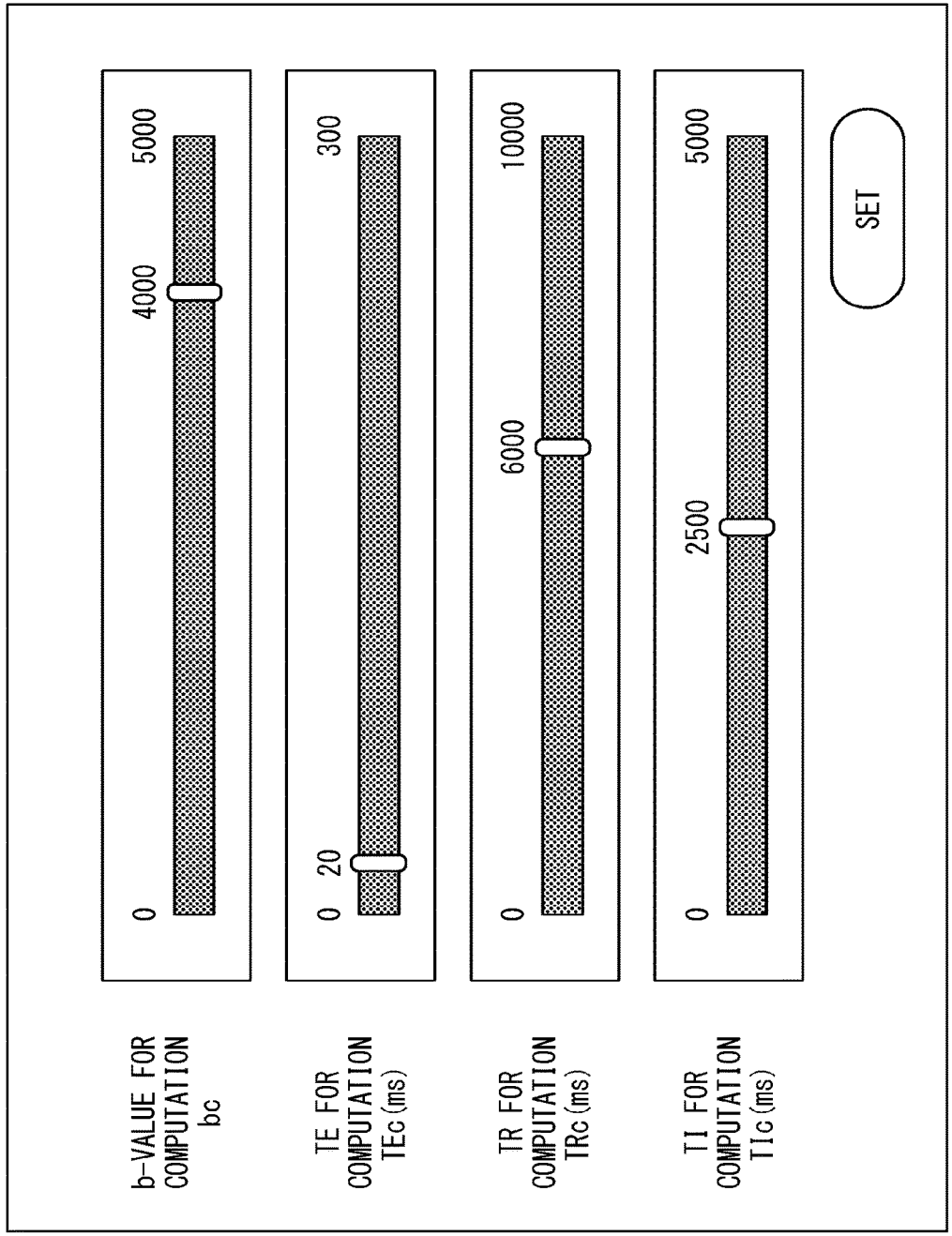
FIG. 18 is a schematic diagram illustrating an example of a screen for setting parameters of generating a computed diffusion-weighted image in the fifth embodiment.

FIG. 18 is a schematic diagram illustrating an example of a screen for setting parameters for generating a computed diffusion-weighted image. As shown in FIG. 18, slide bars corresponding to respective parameters such as a b-value for computation (i.e., bc), an effective echo time for computation (i.e., TEc), a repetition time for computation (i.e., TRc), and an inversion time TI for computation (i.e., TIc) are displayed. A user can set an arbitrary parameter value by moving a slider illustrated as a white longitudinally long ellipse in each slide bar. Note that FIG. 18 is only an example of setting each parameter value and each parameter value may be directly inputted from a keyboard as another example.

Hereinafter, acquisition of MR signals for each diffusion-weighted image in the first to fourth embodiments is supplemented.

In the above-described embodiments, it is assumed that one set of parameters is determined for one pulse sequence, and MR signals for one diffusion-weighted image are acquired by executing one pulse sequence. In the example of FIG. 11, MR signals for the first diffusion-weighted image IM1 are acquired by performing the first pulse sequence corresponding to the first parameter set (b=b1, TE=TE2, TR=TR2) in the step ST200. Afterward, MR signals for the second diffusion-weighted image IM2 are acquired by performing the second pulse sequence corresponding to the second parameter set (b=b2, TE=TE2, TR=TR2).

However, embodiments of the present disclosure are not limited to such an acquisition method. For example, MR signals may be acquired for plural parameter values different from each other in one pulse sequence, while MR signals may be acquired for the different parameter values in other pulse sequences. Then, diffusion-weighted images, respectively corresponding to each of the plural parameter values may be generated from the data acquired from the respective pulse sequences.

For example, a first pulse sequence is performed to acquire a first data. The first data includes a first k-space data corresponding to a first b-value (b1) and a second k-space data corresponding to a second b-value (b2), wherein the first and second k-space data are arranged in a first and second k-space regions, respectively. Then, a second pulse sequence is performed to acquire a second data. The second data also includes the first k-space data corresponding to the first b-value (b1) and the second k-space data corresponding to the second b-value (b2), wherein the first and second k-space data are arranged in complemental regions, i.e., in the second and first k-space regions, respectively. After that, the first k-space data are extracted from the first and second data to generate a first diffusion-weighted image IM1 corresponding to the first b-value (b1), while the second k-space data are extracted from the first and second data to generate a second diffusion-weighted image IM2 corresponding to the second b-value (b2).

In other words, it is enough to generate three or more diffusion-weighted images corresponding to respective three or more parameter sets being different from each other, and the number of pulse sequences and the order of pulse sequences for acquiring three or more diffusion-weighted images are not limited to the above described aspects.

Further, a direction of a b-value (i.e., an application direction of MPG pulses) is not specified in the above described embodiments, because it is not limited to a specific direction. For example, a computed diffusion-weighted image corresponding to an application direction of MPG pulses may be generated by acquiring a diffusion-weighted image under application of MPG pulses in any one of the X-axis direction, the Y-axis direction, and the Z-axis direction.

Furthermore, a diffusion-weighted image may be generated by applying MPG pulses in any one of the X-axis, Y-axis, and Z-axis directions so that a computed diffusion-weighted image corresponding to the application direction. Alternatively, two diffusion-weighted images may be generated by applying MPG pulses in any two of the X-axis, Y-axis, and Z-axis directions. Further alternatively, three diffusion-weighted images may be generated by applying MPG pulses in all of the X-axis, Y-axis, and Z-axis directions.

Additionally or alternatively, one composed diffusion-weighted image may be generated by composing two or three diffusion-weighted images acquired under two or three pulse sequences which are different in application direction of MPG pulses from each other, in the above-described manner. Afterward, one computed diffusion-weighted image may be generated from the composed diffusion-weighted image.

According to the MRI apparatus of at least one of the above-described embodiments, a diffusion-weighted image corresponding to each parameter value different from the actually used imaging parameter value can be computed from the diffusion-weighted image directly acquired by the actual imaging.

Incidentally, a repetition time TR, an effective echo time TE, a b-value, and an inversion time TI in the above-described embodiments are examples of the parameters described in the claims.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An MM apparatus, comprising:
an MRI scanner configured to
set at least N+1 pulse sequences for respectively acquiring at least N+1 diffusion-weighted images, and
acquire the at least N+1 diffusion-weighted images of an object, by respectively using the at least N+1 pulse sequences, wherein each of the pulse sequences has N types of sequence parameters, and values of at least two of the N types of sequence parameters are differently set among the at least N+1 diffusion-weighted images, wherein N is a natural number equal to or more than two; and
processing circuitry configured to
compute values of N types of tissue parameters of the object, pixel by pixel, by using signal intensities of the acquired at least N+1 diffusion-weighted images and the set values of the sequence parameters, and
generate a computed diffusion-weighted image corresponding to an arbitrary value of the sequence parameter that is set separately from the sequence parameters for acquiring the diffusion-weighted image of the object,
wherein the computed diffusion-weighted image is generated by computing intensities of the computed diffusion-weighted image, pixel by pixel, using at least two of the computed values of the N types of tissue parameters of the object, the arbitrary value of the sequence parameter, and the signal intensities of the acquired diffusion-weighted images.

2. The MM apparatus according to claim 1,
wherein the N types of sequence parameters include at least two of a diffusion-enhancing factor b-value, an effective echo time TE, and a repetition time TR.

3. An MM apparatus, comprising:
an MRI scanner configured to
set at least N+1 pulse sequences for respectively acquiring at least N+1 diffusion-weighted images, and
acquire the at least N+1 diffusion-weighted images of an object by respectively using the at least N+1 pulse sequences (a) by means of an imaging method using an IR (inversion recovery) pulse and an imaging method without the IR pulse, or (b) by means of imaging methods each using IR pulses in which respective TI(s) (inversion time) are set to different values, wherein each of the pulse sequences has N types of sequence parameters, and values of at least two of the N types of sequence parameters are differently set among the at least N+1 diffusion-weighted images, wherein N is a natural number equal to or more than two; and
processing circuitry configured to
compute values of N types of tissue parameters of the object, pixel by pixel, by using signal intensities of the acquired at least N+1 diffusion-weighted images and the set values of the sequence parameters, and
generate a computed diffusion-weighted image corresponding to an arbitrary value of the sequence parameter that is set separately from the sequence parameters for acquiring the diffusion-weighted image of the object,
wherein the computed diffusion-weighted image is generated by computing intensities of the computed diffusion-weighted image, pixel by pixel, using at least two of the computed values of the N types of tissue parameters of the object, the arbitrary value of the sequence parameter, and the signal intensities of the acquired diffusion-weighted images.

4. The MRI apparatus according to claim 3,
wherein the N types of sequence parameters include at least two of a diffusion-enhancing factor b-value, an effective echo time TE, and the inversion time TI.

5. An MRI apparatus, comprising:
an MRI scanner configured to
set at least N+1 pulse sequences for respectively acquiring at least N+1 diffusion-weighted images, and
acquire, by means of imaging methods each using IR pulses, the at least N+1 diffusion-weighted images by respectively using the at least N+1 pulse sequences, wherein each of the pulse sequences has N types of sequence parameters, and values of at least two of the N types of sequence parameters are differently set among the at least N+1 diffusion-weighted images, wherein N is a natural number equal to or more than two; and
processing circuitry configured to
compute values of N types of tissue parameters of the object, pixel by pixel, by using signal intensities of the acquired at least N+1 diffusion-weighted images and the set values of the sequence parameters, and
generate a computed diffusion-weighted image corresponding to an arbitrary value of the sequence parameter that is set separately from the sequence parameters for acquiring the diffusion-weighted image of the object,
wherein the computed diffusion-weighted image is generated by computing intensities of the computed diffusion-weighted image, pixel by pixel, using at least two of the computed values of the N types of tissue parameters of the object, the arbitrary value of the sequence parameter, and the signal intensities of the acquired diffusion-weighted images.

6. The MRI apparatus according to claim 5,
wherein the processing circuitry is further configured to generate the computed diffusion-weighted image by setting an inversion time in such a manner that an excitation pulse is applied at a timing when longitudinal magnetization of cerebrospinal fluid recovers from a negative value to zero.

7. The MRI apparatus according to claim 1,
wherein the processing circuitry is further configured to generate the computed diffusion-weighted image such that an effective echo time of the computed diffusion-weighted image corresponds to (a) a shortest effective echo time among effective echo times of the acquired diffusion-weighted images, or (b) an effective echo time shorter than the shortest effective echo time.

8. The MRI apparatus according to claim 1 further comprising a display,
wherein the processing circuitry is further configured to generate a plurality of computed diffusion-weighted images between which a value of a parameter is continuously changed, and
cause the display to continuously display the plurality of computed diffusion-weighted images.

9. The MRI apparatus according to claim 1, wherein, when generating the computed diffusion-weighted image of a nerve tissue, the MRI scanner is further configured to acquire the at least N+1 diffusion-weighted images by applying plural MPG pulses, each MPG pulse of the plural MPG pulses being in a direction perpendicular to a running direction of the nerve tissue.

10. The MRI apparatus according to claim 1,
wherein the MRI scanner is further configured to acquire at least three diffusion-weighted images by setting a b-value of at least one diffusion-weighted image to a value different from a b-value of each of other diffusion-weighted images, and
the processing circuitry is further configured to generate the computed diffusion-weighted image corresponding to an arbitrary b-value and an arbitrary effective echo time, based on a relationship between a signal value of each pixel, a b-value, and an effective echo time of each of the acquired at least three diffusion-weighted images.

11. The MRI apparatus according to claim 10,
wherein the MRI scanner is further configured to acquire at least four diffusion-weighted images by setting a repetition time of at least one diffusion-weighted image to a value different from a repetition time of each of other diffusion-weighted images, and
the processing circuitry is further configured to generate the computed diffusion-weighted image corresponding to an arbitrary b-value, an arbitrary effective echo time, and an arbitrary repetition time, based on a relationship between a signal value of each pixel, a b-value, an effective echo time, and a repetition time of each of the acquired at least four diffusion-weighted images.

12. The MRI apparatus according to claim 1,
wherein the MRI scanner is further configured to acquire the at least N+1 diffusion-weighted images, by performing
a pulse sequence in which MPG (Motion Probing Gradient) pulses are applied after application of an excitation pulse to cause diffusion-weighted transverse magnetization, and the diffusion-weighted transverse magnetization is detected by an echo planner imaging type sequence, or
a pulse sequence in which MPG pulses are applied after application of an excitation pulse to cause diffusion-weighted transverse magnetization, diffusion-weighted longitudinal magnetization is generated by returning the diffusion-weighted transverse magnetization to longitudinal magnetization, and a magnetic resonance signal is detected by a GRE (gradient echo) type sequence or an SSFP (steady-state free precision) type sequence.

13. The MRI apparatus according to claim 1,
wherein the MRI scanner is further configured to acquire the at least N+1 diffusion-weighted images in such a manner that at least one of the at least N+1 diffusion-weighted images is acquired by an ordinary pulse sequence that does not include application of an MPG (Motion Probing Gradient) pulse, the ordinary pulse sequence including at least one of an SE (spin echo) type sequence, an FSE (fast spin echo) type sequence, and a GRE (gradient echo) type sequence.

14. The MRI apparatus according to claim 1 further comprising a display,
wherein the processing circuitry is further configured to cause the display to display a recommended value of a parameter for acquiring the at least N+1 diffusion-weighted images.

15. An image processing device, comprising:
input circuitry configured to input at least N+1 diffusion-weighted images of an object, which are generated by respectively using at least N+1 pulse sequences, wherein each of the pulse sequences has N types of sequence parameters, and values of at least two of the N types of sequence parameters are differently set among the at least N+1 diffusion-weighted images, wherein N is a natural number equal to or more than two; and
processing circuitry configured to
compute values of N types of tissue parameters of the object, pixel by pixel, by using signal intensities of the acquired at least N+1 diffusion-weighted images and the set values of the sequence parameters, and
generate a computed diffusion-weighted image corresponding to an arbitrary value of the sequence parameter that is set separately from the sequence parameters for acquiring the diffusion-weighted image of the object,
wherein the computed diffusion-weighted image is generated by computing intensities of the computed diffusion-weighted image, pixel by pixel, using at least two of the computed values of the N types of tissue parameters of the object, the arbitrary value of the sequence parameter, and the signal intensities of the acquired diffusion-weighted images.

16. The image processing device according to claim 15, further comprising a display,
wherein the processing circuitry is further configured to cause the display to display a parameter used for generating the computed diffusion-weighted image in such a manner that a displayed parameter can be changed by operation on the image processing device.

17. A generation method of a diffusion-weighted image, the method comprising:
setting at least N+1 pulse sequences for respectively acquiring at least N+1 diffusion-weighted images;
acquiring the at least N+1 diffusion-weighted images of an object, by respectively using the at least N+1 pulse sequences, wherein each of the pulse sequences has N types of sequence parameters, and values of at least two of the N types of sequence parameters are differently set among the at least N+1 diffusion-weighted images, wherein N is a natural number equal to or more than two;
computing values of N types of tissue parameters of the object pixel by pixel, by using signal intensities of the acquired at least N+1 diffusion-weighted images and the set values of the sequence parameters; and
generating a computed diffusion-weighted image corresponding to an arbitrary value of the sequence parameter that is separately set from the sequence parameters for acquiring the diffusion-weighted image of the object, wherein the computed diffusion-weighted image is generated by computing intensities of the computed diffusion-weighted image, pixel by pixel, using at least two of the computed values of the N types of tissue parameters of the object, the arbitrary value of the sequence parameter, and the signal intensities of the acquired diffusion-weighted images.

* * * * *